United States Patent [19]
Nakano et al.

[11] Patent Number: 6,030,747
[45] Date of Patent: Feb. 29, 2000

[54] CHEMICALLY AMPLIFIED RESIST LARGE IN TRANSPARENCY AND SENSITIVITY TO EXPOSURE LIGHT LESS THAN 248 NANOMETER WAVELENGTH AND PROCESS OF FORMING MASK

[75] Inventors: Kaichiro Nakano; Katsumi Maeda; Shigeyuki Iwasa; Etsuo Hasegawa, all of Tokyo, Japan

[73] Assignee: NEC Corporation, Tokyo, Japan

[21] Appl. No.: 09/124,673

[22] Filed: Jul. 29, 1998

Related U.S. Application Data

[63] Continuation-in-part of application No. 09/036,219, Mar. 6, 1998.

[30] Foreign Application Priority Data

Mar. 7, 1997 [JP] Japan ........................... 9-52678
Feb. 20, 1998 [JP] Japan ........................... 10-38207

[51] Int. Cl.$^7$ ................................................. G03F 7/004
[52] U.S. Cl. ........................................ 430/270.1; 430/910
[58] Field of Search ................................ 430/270.1, 905, 430/910

[56] References Cited

U.S. PATENT DOCUMENTS

| | | | |
|---|---|---|---|
| 5,376,504 | 12/1994 | Graziano et al. | 430/270.1 |
| 5,443,690 | 8/1995 | Takechi et al. | 430/286.1 |
| 5,851,727 | 12/1998 | Choi et al. | 430/270.1 |

FOREIGN PATENT DOCUMENTS

| | | |
|---|---|---|
| 227660 | 6/1990 | Japan . |
| 5134416 | 5/1993 | Japan . |
| 725846 | 1/1995 | Japan . |
| 882925 | 3/1996 | Japan . |
| 8259626 | 10/1996 | Japan . |
| 5265212 | 10/1998 | Japan . |

OTHER PUBLICATIONS

Tx Neenan, et al., "Chemically Amplified Resists: A Lithographic Comparison of Acid Generating Species", by SPIE vol. 1086 Advances in Resist Technology and Processing VI(1989), pp. 2–10.

"Arf excimer Laser Lithography (3)—Evalution of Resist". "Allicycle Polymer for ArF and KrF Excimer Resist Based on Chemical Amplification"; Satoshi Takechi et al. pp. 439–446.

Single–Layer chemically amplified photoresists for 193–nm lithography by J. Vac Sci. Technol. B. vol. 11, No. 6 Nov./Dec. 1993.

Novel Alkaline–Soluble Alicyclic Polymer Poly(TCDMA-COOH) for ArF Chemically Amplified Positive Resists by SPIE vol. 2724 pp. 377–385; Katsumi Maeda et al.

A New Preparation of Triarylsulfonium and —selenonium Salts via the Copper(II)—Catalyzed Arylation of Sulfides and Selenides with Diaryliodonium Salts by J. Org. Chem vol. 43 No. 15 1978.

"Chemical Amplification Positive Resist Systems Using Novel Sulfonates as Acid Generators" T. Ueno et al. pp. 413–424.

"Challenges in Excimer Laser Lithography for 256M DRAM and beyond" M. Endo et al. IEDM Tech. Digest 1992.

*Primary Examiner*—John S. Chu

[57] ABSTRACT

Monomers expressed by the following general formula are polymerized so as to obtain a polymer, and the polymer and a photoacid generator are dissolved in a solvent so as to form a chemically amplified resist layer large in both transparency and sensitivity to ArF excimer laser light and improved in resolution.

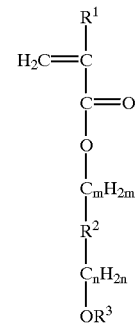

wherein $R^1$ represents a hydrogen atom or a methyl group, $R^2$ represents a bridged hydrocarbon group having the carbon number between 7 and 22, m equals 0 or 1, n equals 0 or 1 and $R^3$ represents a hydrogen atom, a methyl group or an acetyl group.

4 Claims, 4 Drawing Sheets

CHEMICALLY AMPLIFIED RESIST LARGE IN TRANSPARENCY AND SENSITIVITY TO EXPOSURE LIGHT LESS THAN 248 NANOMETER WAVELENGTH AND PROCESS OF FORMING MASK

CROSS-REFERENCE TO RELATED APPLICATIONS

This application is a continuation-in-part application Ser. No. 09/036,219, filed Mar. 6, 1998, pending.

FIELD OF THE INVENTION

This invention relates to a chemically amplified resist and, more particular, to a chemically amplified resist sensitive to ultra violet light, far ultra voilet light, an electron beam, an ion beam and an X-ray and a process of forming a mask from the chemically amplified resist.

DESCRIPTION OF THE RELATED ART

The integration density of a semiconductor integrated circuit device such as a dynamic random access memory device is getting higher and higher, and, accordingly, a lithography is expected to transfer a miniature pattern to a photo-sensitive compound layer spread over a thin layer to be patterned.

One of the approaches to the miniature pattern is to use exposure light with a shorter wavelength. 256 mega-bit dynamic random access memory devices are scheduled in near feature, and are designed to have the minimum pattern width equal to or less than 0.25 micron. In order to achieve the minimum pattern width, KrF excimer laser would be used for the pattern transfer rather than i-ray, because the KrF excimer laser has the wavelength of 248 nanometers shorter than i-ray's wavelength of 365 nanometers.

The dynamic random access memory device of the next generation, i.e., 1 giga-bit dynamic random access memory device would have the minimum pattern width equal to or less than 0.2 micron, and such a miniature pattern requires a shorter wavelength. In fact, research and development efforts are made on a lithography using ArF excimer laser of 193 nanometers wavelength.

The lithography for the ultra large-scale integration requires a high-sensitive high-resolution resist material. The high sensitivity is desirable, because an image is transferred to the resist layer through a small amount of exposure light. The small amount of exposure light reduces damage to the optical component such as a lens incorporated in the aligner. Moreover, the pattern transfer through the small amount of exposure light less deteriorates the laser source gas sealed in the excimer laser light source. The laser source gas is so expensive that the pattern transfer through the small amount of exposure light reduces the production cost of ultra large-scale integration.

A chemically amplified resist achieves high sensitivity. The chemically amplified resist contains a photoacid generator such as cationic generator, which provides photo-chemically generated acid in exposure to active light. Japanese Patent Publication of Examined Application No. 2-27660 discloses chemically amplified resist composed of triphenylsulfonium-hexafluoroacenato and poly(t-butoxycarbonyloxy-α-methylstyrene. The chemically amplified resist is featured by the components. When the chemically amplified resist is exposed to photo radiation, the photochemical acid-generator generates protonic acid. The protonic acid is moved through the solid-state resist during the post heat treatment, and serves as a thermally driven catalyst so as to increase the reaction hundred times to thousand times. If we define efficiency of photochemical reaction as the rate of the chemical reaction per photon, the efficiency of photochemical reaction of a conventional resist is less than 1. However, the chemically amplified resist drastically increases the efficiency of the photochemical reaction, and enhances the sensitivity to the photo radiation. Most of the resist material is of the chemically amplified type, and the chemically amplified function is indispensable for a new resist material.

The prior art photo-sensitive synthetic resin compound is hardly available for the lithography using excimer laser light equal to or less than 220 nanometer wavelength, because the resin component is poor in transparency and resistance against an etchant.

The prior art lithography uses the exposure light longer in wavelength than KrF excimer laser light, which has the wavelength of 248 nanometers, and the photo-sensitive synthetic resin contains a resin component such as Novolak resin or poly (p-vinylphenyl). The resin available for the resist has an aromatic ring in the structural unit, and the aromatic ring imparts the dry etching resistance to the resist. However, the aromatic ring is strong in light absorption to the light equal to or less than 220 nanometer wavelength, and the prior art resin is hardly used for the resist, because a surface portion of the resist absorbs most of the exposure light. In other words, the exposure light does reach the boundary between the resist and the substrate, and a miniature pattern is hardly transferred to the resist mask. This phenomenon is reported by Sasago et. al. in "ArF Excimer Laser Lithography (3)—Evaluation of Resist—", proceedings of Joint Lectures of 35 Meeting of Applied Physics Society, 1p-K-4, 1989. For this reason, the lithography of the next generation requires a resin which would achieve large dry etching resistance without the aromatic ring.

Several high-molecular compounds which have large dry etching resistance and good transparency to 193 nanometer wavelength light has been proposed. Followings are the prior art high-molecular compounds already known.

Takechi et. al. discloses copolymer of adamantyl-methacrylate and tertbutylmethacrylate in "Alicyclic Polymer for ArF and KrF Excimer Resist Based on Chemical Amplification", Journal of photopolymer Science and Technology, volume 5, Number 3 (1992), pages 439 to 446. Adamantyl-methacrylate forms a unit of the copolymer, and is a kind of alicyclic high-molecular compound.

Japanese Patent Publication of Unexamined Application (JPA) No. 5-265212 discloses a high-molecular compound similar to that proposed by Takechi et. al.

Endo et. al. discloses a poly(norbornyl methacrylate) in "Challenges in Excimer Laser Lithography for 256 DRAM and beyond", proceedings of IEDM, CA14-18, San Francisco, 1992.

G. M. Wallraff et. al. discloses a copolymer with a poly (isobornyl methacrylate) unit in "Single-layer chemically amplified photoresists for 193-nm lithography", Journal of Vacuum Science and Technology, B11, volume 6, pages 2783 to 2788.

Japanese Patent Publication of Unexamined Application (JPA) No. 8-82925 teaches a poly(menthyl-methacrylate) unit.

Alicyclic group such as the adamantyl group, norbornyl group, isobornyl group or menthyl group imparts good dry etching resistance to these prior art high-molecular compounds. However, there is no residual unit in the group for changing the solubility between an exposed portion and a non-exposed portion. For this reason, the high-molecular compounds are barely available for a resin component when they form a copolymer together with a comonomer, in which a carboxyl group of the methoacryl acid unit is protected, such as tertial methacrylate or tetrahydropyranyl methacrylate. In order to achieve the difference in solubility between the exposed portion and the non-exposed portion, the prior art resist requires the comonomer between 30 molecular percent and 50 molecular percent. The comonomer is small in dry etching resistance so that the prior art resist is also poor in the dry etching resistance. This means that the prior art resin component is hardly available for the actual lithography.

Moreover, the alicyclic group and polar converting group are hydrophobic, and, acordingly, the polymer with the hydrophobic group is poor in adhesion to a silicon substrate. For this reason, a miniature pattern is less reproducible by using the prior art resist. Another drawback inherent in the prior art resist is scum or residue left in the alkaline developing solution, and the residue deteriorates the developing solution.

In order to overcome the drawbacks, the present inventors proposed an improved polymer and photo-sensitive resin compound in Japanese Patent Publication of Unexamined Application No. 8-259626. The polymer was well transparent to the exposure light having the wavelength equal to or less than 220 nanometer wavelength, good in dry etching resistance and large in solubility between an exposed portion and non-exposed portion.

In detail, the alicyclic group imparts good dry etching resistance to the polymer, and the carboxyl group is large in polarity. The present inventors bonded the alicylic group to the carboxyl group, and confirmed that the polymer was improved in polarity and hydrophilic property. Using the polymer, the present inventors produced the photo-sensitive resin compound. The photo-sensitive resin compound exhibited good transparency, i.e., 70 percent per 1 micron, good dry etching resistance as large as the chemically amplified positive resist with a poly (vinylphenol) base appropriate to KrF laser light, good adhesion to the silicon substrate and good solubility to the alkaline developing solution such as the alkaline developer containing tetramethylammoniumhydroxyde at 2.38 percent by weight. A typical example of the alkaline developer was NMD-3 manufactured by Tokyo Applied Chemical Industry Corporation. Maeda, who was one of the present inventors, et. al. evaluated the pattern forming characteristics of the photo-sensitive resist compound. Using a prototype of an aligner built by Nikkon Corporation, which was equipped with an ArF excimer laser source and a lens unit with the numerical aperture of 0.6, 0.16 micron line-and-space pattern was transferred to the photo-sensitive resist compound layer. The latent image of the line-and-space pattern was developed, and Maeda et. al. confirmed good resolution as reported in "Novel Alkaline-Soluble Alicyclic Polymer Poly (TCDMACOOH) for ArF Chemically Amplified Positive Resists", Proceedings of SPIE, volume 2724, pages 377 to 385.

Thus, the prior art chemically amplified resist already proposed by the present inventors exhibits fairly good properties to the exposure light less than 200 nanometer wavelength and alkaline solution. However, the prior art chemically amplified resist encounters problems as follows.

First, the carboxyl group gives good polarity to the resin compound as described hereinbefore, and causes the prior art chemically amplified resist to achieve high resolution. However, the carboxyl group is dissolved in the alkaline solution faster than the poly(vinylphenol) resin. This means that non-exposed portion of the prior art chemically amplified resist is liable to be dissolved in the alkaline developing solution. As a result, a resist mask is decreased in thickness during the developing stage, and the reproducibility of miniature pattern does not satisfy the manufacturer. Thus, the small resistance of the non-exposed portion against the allkaline developing solution is the first problem.

If the polar converting group such as the tert-butyl group or tetrahydropyranyl group is introduced into the chemically amplified resist, the polar converting group enhances the protective ratio of the protective group, and the carboxylic acid is allowed to remain in the polymer. This results in improvement of the resistance against the alkaline developing solution. However, the polar converting group decreases the polarity of the polymer, and makes the adhesion poor. The poor adhesion makes a miniature pattern resist mask crumbled.

Thus, there is a trade-off in the prior art chemically amplified resist already proposed between the adhesion and the resistance of the non-exposed resist portion against the alkaline developing solution such as the developing solution containing tetramethylammoniumhydroxyde at 2.38 weight percent popular in the conventional lithography.

SUMMARY OF THE INVENTION

It is therefore an important object of the present invention to provide a chemically amplified resist, which exhibits large resistance against an alkaline developing solution and large adhesion.

It is also an important object of the present invention to provide a process of forming a resist mask from the chemically amplified resist.

The present inventors contemplated the problems inherent in the prior art chemically amplified resist, and found a new compound made copolymer which exhibits good resistance against an alkaline developing solution and large adhesion.

To accomplish the above objects the present invention proposes to polymerize a monomer containing alicyclic hydrocarbon residue and a polar group lower in polarity than the carboxyl group. The alicyclic hydrocarbon residue gives good transparency to exposure light less than 220 nanometer wavelength and large etching resistance to the polymer, and examples of the polar group are hydroxyl group, methoxy group and acetyloxy group.

In accordance with one aspect of the present invention, there is provided a chemically amplified resist comprising.

A photoacid generator contained at 0.2 part to 25 parts, and a polymer contained at 50 parts to 99.8 parts by weight and copolymerized between compound and monomer expressed by the general formula:

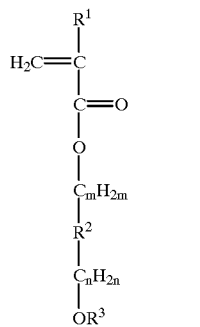

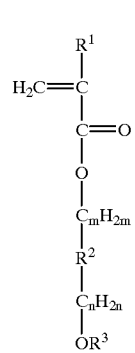

(1)

Wherein $R^1$ represents a hydrogen atom or a methyl group, $R^2$ represents a bridged hydrocarbon group having the carbon number between 7 and 22, m equals 0 or 1, n equals 0 or 1 and $R^3$ represents a hydrogen atom, a methyl group or an acetyl group.

In accordance with another aspect of the present invention, there is provided a chemically amplified resist comprising a photoacid generator contained at 0.2 part to 25 parts, a cross linking agent activated in the presence of acid and contained at 1 part to 40 part and a polymer contained at 50 parts to 98.8 parts by weight and copolymerized between compound and monomer expressed by the general formula:

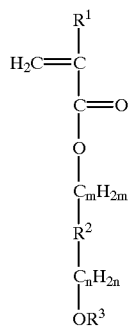

Wherein $R^1$ represents a hydrogen atom or a methyl group, $R^2$ represents a bridged hydrocarbon group having the carbon number between 7 and 22, m equals 0 or 1, n equals 0 or 1 $R^3$ represents a hydrogen atom, a methyl group or an acetyl group.

In accordance with yet another aspect of the present invention, there is provided a process for forming a resist mask, comprising the steps of a) preparing a solid structure, b) spreading a chemically amplified resist over a surface of said solid structure so as to form a chemically amplified resist layer thereon, c) radiating light through a mask onto said chemically amplified resist layer so as to form a latent image therein and d) developing said latent image so as to form a resist mask from said chemically amplified resist layer, and the chemically amplified resist comprises a photoacid generator contained at 0.2 part to 25 parts and a polymer contained at 50 parts to 99.8 parts by weight and copolymerized between compound and monomer expressed by the general formula (1)

Wherein $R^1$ represents a hydrogen atom or a methyl group, $R^2$ represents a bridged hydrocarbon group having the carbon number between 7 and 22, m equals 0 or 1, n equals 0 or 1 and $R^3$ represents a hydrogen atom, a methyl group or an acetyl group.

In accordance with still another aspect of the present invention, there is provided a process for forming a resist mask, comprising the steps of: a) preparing a solid structure; b) spreading a chemically amplified resist over a surface of the solid structure so as to form a chemically amplified resist layer thereon, the chemically amplified resist comprising a photoacid generator contained at 0.2 part to 25 parts by weight, a cross linking agent activated in the presence of acid and contained at 1 part to 40 parts by weight and a polymer contained at 50 parts to 98.8 parts by weight and copolymerized between compound and monomer expressed by the general formula:

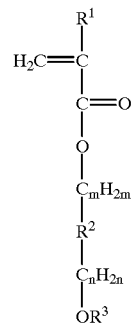

Wherein $R^1$ represents a hydrogen atom or a methyl group, $R^2$ represents a bridged hydrocarbon group having the carbon number between 7 and 22, m equals 0 or 1, n equals 0 or 1 and $R^3$ represents a hydrogen atom, a methyl group or an acetyl group; c) radiating light through a mask onto said chemically amplified resist layer so as to form a latent image therein; and d) developing said latent image so as to form a resist mask from said chemically amplified resist layer.

The bridged hydrocarbon group may be tricyclo[$5.2.1.0^{2,6}$]decanediyl group, norbornanediyl group, methylnorbornanediyl group, isobornandiyl group, tetracyclo[$4.4.0.1^{2,5}.1^{7,10}$]dodecanediyl group, methyltetracyclo[$4.4.0.1^{2,5}.1^{7,10}$]dodecanediyl group, 2,7-dimethyltetracyclo[$4.4.0.1^{2,5}.1^{7,10}$]dodecanediyl group, 2,10-di-methyltetracyclo[$4.4.0.1^{2,5}.1^{7,10}$]dodecanediyl group, 11,12-dimethyl-tetra-cyclo[$4.4.0.1^{2,5}.1^{7,10}$]dodecanediyl group, hexacyclo[$6.6.1.1^{3,6}.1^{10,13}.0^{2,7}.0^{9,14}$]heptadecanediyl group, octacyclo[$8.8.1^{2,9}.1^{4,7}.1^{11,18}.1^{13,16}.0.0^{3,8}.0^{12,17}$]docosanedyl group or adamantanediyl group. These kinds of bridged hydrocarbon group have respective structural formulae shown in table 1.

TABLE 1

| Bridged Hydrocarbon Group | Structural Formula |
| --- | --- |
| Norbornanediyl Group | |
| Methylnornornandyl Group | |
| isobornandyl group | |
| tricyclo[5.2.1.0$^{2,6}$] decanediyl group | |
| tetracyclo[4.4.0.1$^{2,5}$.1$^{7,10}$] dodecanediyl group | |
| methyltetracyclo[4.4.0.1$^{2,5}$.1$^{7,10}$] dodecanediyl group, | |
| 2,7-dimethyltetracyclo[4.4.0.1$^{2,5}$.1$^{7,10}$] dodecanediyl group, | |
| 2,10-dimethyltetracyclo[4.4.0.1$^{2,5}$.1$^{7,10}$] dodecanediyl group, | |
| 11,12-dimethyl-tetracyclo[4.4.0.1$^{2,5}$.1$^{7,10}$] dodecanediyl group, | |
| hexacyclo[6.6.1.1$^{3,6}$.1$^{10,13}$.0$^{1,7}$.0$^{9,14}$] heptadecanediyl group, | |
| ocatacyclo[8.8.1$^{2,9}$.1$^{4,7}$.1$^{11,18}$.1$^{13,16}$.0.0$^{3,8}$.0$^{12,17}$] docosanedyl group | |

The polymer copolymerized between the vinylmonomer and other compound may have a weight average molecular weight ranging between 1,000 and 50,000, and may be expressed by the general formula (2):

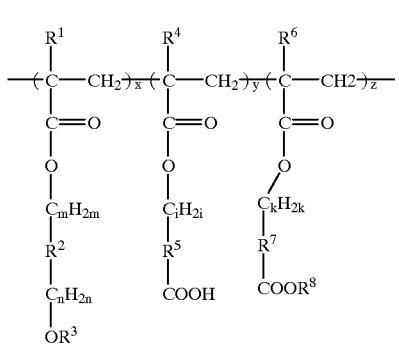

(2)

Wherein $R^1$, $R^4$ and $R^6$ represent a hydrogen atom or a methyl group, $R^2$, $R^5$ and $R^7$ represent a bridged hydrocarbon group having the carbon number from 7 to 22, $R^3$ represents a hydrogen atom, a methyl group or an acetyl group, $R^8$ represents a group decomposed by acid, m equals 0 or 1, n equals 0 or 1, i equals 0 or 1, k equals zero or 1, x+y+z=1, x ranges from 0.05 to 0.75, y ranges from zero to 0.8 and z ranges from zero to 0.6.

The bridged hydrocarbon group may be tricyclo[$5.2.1.0^{2,6}$]decanediyl group, norbornanediyl group, methylnorbornanediyl group, isobornandyl group, tetracyclo[$4.4.0.1^{2,5}.1^{7,10}$]dodecanediyl group, methyltetracyclo[$4.4.0.1^{2,5}.1^{7,10}$]dodecanediyl group, 2,7-dimethyltetracyclo[$4.4.0.1^{2,5}.1^{7,10}$]dodecanediyl group, 2,10-dimethyltetracyclo[$4.4.0.1^{2,5}.1^{7,10}$]dodecanediyl group, 11,12-dimethyl-tetra-cyclo[$4.4.0.1^{2,5}.1^{7,10}$]dodecanediyl group, hexacyclo[$6.6.1.1^{3,6}.1^{10,13}.0^{2,7}.0^{9,14}$]heptadecanediyl group, octacyclo[$8.8.1^{2,9}.1^{4,7}.1^{11,18}.1^{13,16}.0.0^{3,8}.0^{12,17}$]docosanedyl group or adamantanediyl group listed in Table 1.

Examples of the group decomposed by acid are tert-butyl group, tetrahydropyran-2-ir group, 4-methoxytetrahydropyran-4-ir group, 1-ethoxyethyl group, 1-buthoxyethyl group, 1-propoxyethyl group and 3-oxocyclohexyl group.

BRIEF DESCRIPTION OF THE DRAWINGS

The features and advantages of the chemically amplified resist and the process will be more clearly understood from the following description taken in conjunction with the accompanying drawings, in which.

SYNTHESIS OF CHEMICALLY AMPLIFIED RESIST

Figure 1:
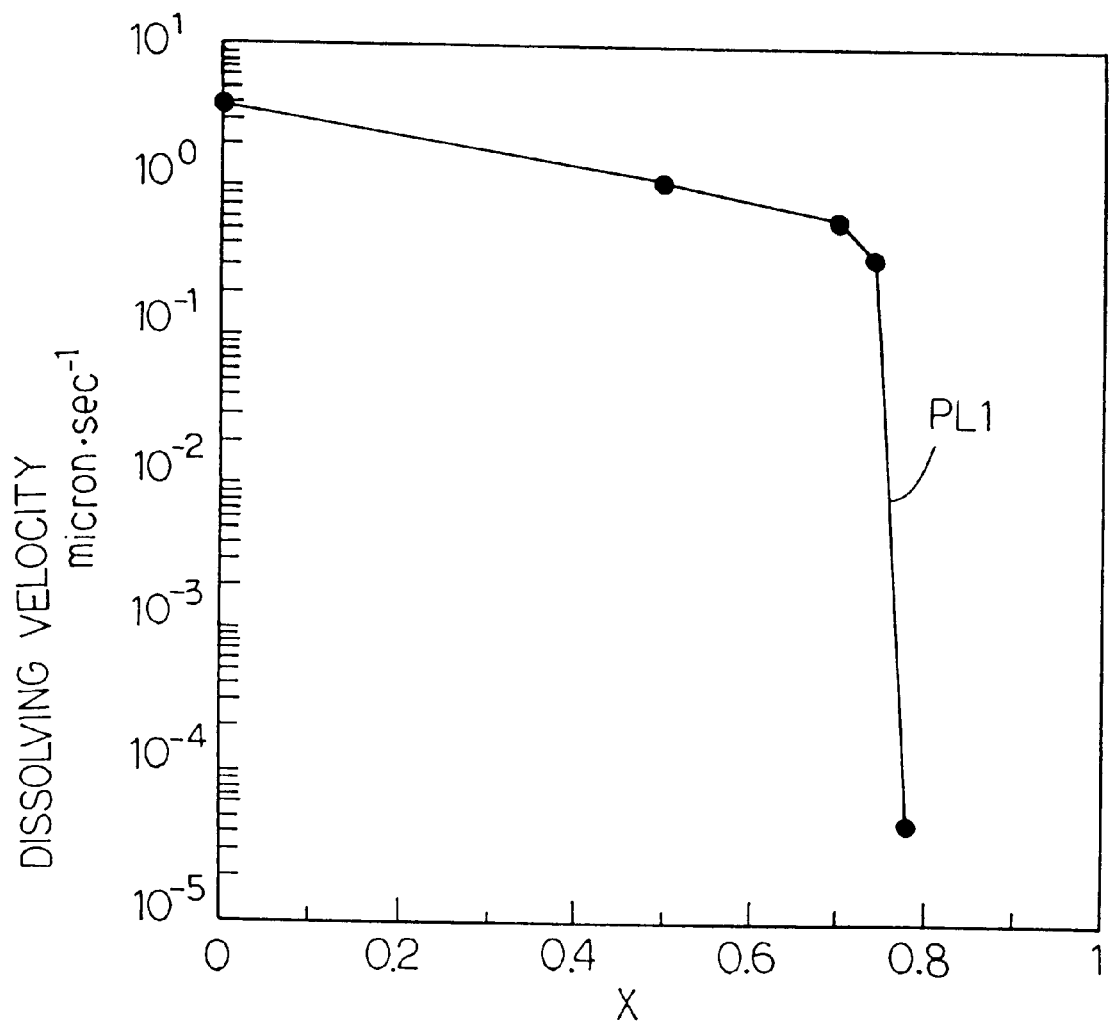
FIG. 1 is a graph showing relation between dissolving velocity and "x" in the general formula (2)

When $R^1$ is a hydrogen atom or a methyl group, the general formula (1) represents a derivative of monomethacrylatemonool or a derivative of monoacrylatemonool, which are synthesized as follows.

First, diol compound is prepared, and is expressed by the general formula (3):

(3)

Where $R^2$ is the bridged hydrocarbon group having the carbon number between 7 and 22 such as, for example, tricyclo[$5.2.1.0^{2,6}$]decanediyl group, norbornanediyl group, methylnorbornanediyl group, isobornandyl group, tetracyclo[$4.4.0.1^{2,5}.1^{7,10}$]dodecanediyl group, methyltetracyclo[$4.4.0.1^{2,5}.1^{7,10}$]dodecanediyl group, 2,7-dimethyltetracyclo[$4.4.0.1^{2,5}.1^{7,10}$]dodecanediyl group, 2,10-di-methyltetracyclo[$4.4.0.1^{2,5}.1^{7,10}$]dodecanediyl group, 11,12-dimethyltetra-cyclo[$4.4.0.1^{2,5}.1^{7,10}$]dodecanediyl group, hexacyclo[$6.6.1.1^{3,6}.1^{10,13}.0^{2,7}.0^{9,14}$]heptadecanediyl group or octacyclo[$8.8.1^{2,9}.1^{4,7}.1^{11,18}.1^{13,16}.0.0^{3,8}.0^{12,17}$]docosanedyl group listed in Table 1, m is zero or 1, and n is zero or 1.

Subsequently, the cyclic hydrocarbon reacts with methacryloylchloride or acryloylchloride equal in mole to the cyclic hydrocarbon for 1 hour to 10 hours in solvent such as anyhydrous tetrahydrofuran or methylene chloride in the presence of triethylamine or pyridine cooled with ice or lower than 50 degrees in centigrade. Thereafter, the reaction product is treated and refined as usual.

Monomer expressed by the general formula (1) or copolymer using the same is polymerized in solvent such as tetrahydrofuran in inert ambience created by argon or nitrogen. Appropriate radical initiator is added thereto, and the ratio of monomer/initiator by mole ranges from 10 to 200. Agitation is continued for 0.5 hour to 10 hours at 50 degrees to 70 degrees in centigrade.

The average degree of polymerization which is equivalent to n in general formula (2) ranges from 10 to 500 and, preferably, between 10 and 200.

The present inventors evaluated the transparency of the polymer as follows. A thin film of the polymer was formed at 1.0 micron thick. ArF excimer laser light of 193 nanometer wavelength radiated the thin film, and the transparency was measured. The transparency to the ArF excimer laser ranged between 65 percent to 74 percent, and the polymer was commetially available for the lithography using he ArF excimer layer light.

Subsequently, the present inventors evaluated the adhesion of the polymer to a silicon substrate, and confirmed that the polymer was strongly adhered to the silicon substrate.

The present inventors evaluated the etching speed of the polymer. First, the present inventors prepared the polymer expressed by the general formula (2) where $R^1$ was a hydrogen atom, $R^3$ was a methyl group, $R^2$ was tricyclo[$5.2.1.0^{2,6}$]decanedimethyl, and a=1, b, c, d=0. The polymer was formed into a thin film, and reactive ion etching was carried out for the thin film by using $CF_4$ gaseous etchant. The etching rate was 180 angstroms per minute, and was as large as poly(vinylphenol).

As defined in claims, the essential components of the chemically amplified resist are the polymer, the photoacid generator and a solvent. The photoacid generator is preferably responsive to light having wavelength equal to or less than 300 nanometers and, preferably equal to or less than 220 nanometer wavelength so as to photochemically generate acid. Another requirement is to be dissolved in an organic solvent together with the polymer and uniformly spread over the solid-state structure such as a semiconductor substrate structure. Any photoacid generator is available for the chemically amplified resist according to the present invention in so far as the photoacid generator satisfies the above requirements. The chemically amplified resist may contain more than one photoacid generator, and sensitizer may be further mixed into the chemically amplified resist.

In case where the chemically amplified resist is used in the lithography for 220 nanometer wavelength exposure light, not only the polymer but also the photoacid generator are expected to be transparent to the exposure light. If the photoacid generator is a compound with aromatic ring such as triphenylsulfonium-hexafluoroacenato disclosed in Japanese Patent Publication of Unexamined Application No. 2-27660, it is necessary to strictly control the content of the photoacid generator so as not to decrease the transparency to the exposure light.

In order to achieve large transparency to the exposure light equal to or less than 220 nanometer wavelength, the present inventors have already proposed photoacid generator in Japanese Patent Publication Nos. 5-174528 and 5-174532, and the photoacid generator is lower in absorption and higher in sensitivity than the conventional photoacid generator with the aromatic ring.

The photoacid generator proposed by the present inventors is expressed by the general formulae (4) or (5)

(4)

Where $R^9$ and $R^{10}$ are a straight chain alkyl group, a branching alkyl group or a cyclic alkyl group, $R^{11}$ is a straight chain alkyl group, a branching alkyl group, a cyclic alkyl group, 2-oxocyclic alkyl group, 2-oxostraight chain alkyl group or a 2-oxobranching alkyl group, and A is a counter ion such as $BF_4{}^-$ $AsF6$, $SbF_6$, $PF_6$, $CF_3COO$, $C10_4$, $CF_3SO_3$ or alkylsulfonato, aryl sulfonato.

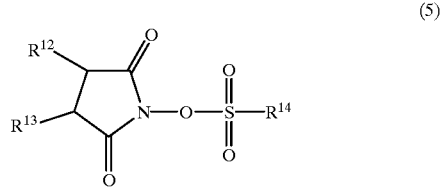

(5)

Where each of $R^{12}$ and $R^{13}$ is a hydrogen atom, a straight chain alkyl group, a branching alkyl group and a cyclic alkyl group, $R^{14}$ is a straight chain alkyl group, a branching alkyl group or a haloalkyl group such as trifluoromethyl or perfluoroalkyl.

Other examples of the photoacid generator available for the chemically amplified resist according to the present invention are disclosed by Jamess V. Crivello et. al. in "A New Preparation of Triarylsulfonium and—selenonium Salts via the Copper(II)—Catalyzed Arylation of Sulfides and Selenides with Diaryliodonium Salts", Journal of the Organic Chemistry, vol. 43, No. 15, pages 3055 to 3058, 1978. The photoacid generators disclosed herein are derivatives of triarylsulfonium salts. Other onium salts are also available for the chemically amplified resist, and are, by way of example, sulfonium salts, iodonium salts, phosphonium salts, diazonium salts and ammonium salts.

T. X. Neenan et. al. proposes other photoacid generators available for the chemically amplified resist according to the present invention in "Chemically Amplified Resists: A Lithographic Comparison of Acid Generating Species", SPIE Proceedings, vol. 1086, pages 2 to 10, 1989. T. X. Neenan et. al. teaches 2,6-dinitrobenzyl esters as the photoacid generator.

1,2,3-tri(methanesulfonyloxy)benzene is proposed by Takumi Ueno et. al. in "Chemical Amplification Positive Resist Systems Using Novel Sulfonates as Acid Generators", Proceedings of PME "89, Kodansha, pages 413 to 424, 1990, and is also available for the chemically amplified resist according to the present invention. Japanese Patent Publication of Unexamined Application No. 5-134416 discloses sulfoaceticimide as the photoacid generator.

Thus, there are various photoacid generators available for the chemically amplified resist according to the present invention. Nevertheless, the photoacid generator expressed by the general formulae (4) and (5) are appropriate to the lithography using exposure light equal to or less than 220 nanometer wavelength, because those photoacid generator does not cause the chemically amplified resist to be transparent to the exposure light. Triphenylsufonium and trifluoromethansulfonato, which are hereinbelow abbreviated as "TPS, proposed by Crivello et. al. are, by way of example, extremely high in absorbance to the far ultra-violet light equal to or less than 220 nanometer wavelength, and the extremely strong absorbance sets a limit on the content of the photoacid generator. The present inventors compared TPS with the photoacid generator expressed by the general formulae (4) and (5) as follows.

When the chemically amplified resist expressed by the general formula (2) contained TPS at 1.5 parts by weight, the chemically amplified resist layer of 1 micron thick exhibited the transparency to ArF excimer laser of 193.4 nanometer wavelength at 40 percent. When TPS was decreased to 5.5 parts by weight, the transparency was decreased to 6 percent. On the other hand, when poly(methylmethacrylate) contained a derivative of cyclohexymethyl(2-oxocyclohexyl)sulfoniumtrifuluoromethansulfonato, which is an example of the derivative of the sulfonium salt expressed by the general formula (4), the transparency to the far ultra-violet light was as follows. When the polymer contained the derivative at 5 parts by weight, the transparency was 71 percent. When the derivative was increased to 30 parts by weight, the transparency was 55 percent. Moreover, when the photoacid generator expressed by the general formula (4) was replaced with the photoacid generator expressed by the general formula (5) such as N-hydroxysucciimido-trifluoromethanesulfonato at 5 parts by weight, the transparency was of the order of 50 percent. Thus, the photoacid generators expressed by the general formulae (4) and (5) exhibit extremely small absorbance to the far ultra-violet light ranging between 185.5 nanometer wavelength to 220 nanometer wavelength, and are preferable to the component compound of the chemically amplified resist for ArF excimer laser lithography.

The photoacid generators expressed by the general formulae (4) and (5) are, by way of example, cyclohexylmethyl (2-oxocyclohexyl)sulfoniumtrifluoromethansulfonato, dicyclohexyl(2-oxocyclohexyl) sulfoniumtrifluoromethansulfonato, triphenylsulfoniumtrifluoromethansulfonato, diphenyliodoniumtrifluoromethansulfonato and N-hydroxysucciimidotrifluoromethansulfonato. Of course, the photoacid generator expressed by the general formulae (4) and (5) are never limited to the above examples.

The chemically amplified resist according to the present invention may contains one of the photoacid generators or more than one photoacid generators. When the total amount containing the photoacid generator is expressed by 100 parts, the photoacid generator or generators ranges from 0.2 part to 25 parts by weight and, preferably, between 1 part and 15 parts by weight. If the photoacid generator is less than 0.2 part, the chemically amplified resist is too small in photo-sensitivity to exactly form a latent image. On the other hand, if the photoacid generator is greater than 25 parts by weight, the chemically amplified resist is not uniformly spread, and scum or residue is left in the developing solution. The content of high-molecular compound is 75 parts to 99.8 parts by weight with respect to the total amount containing the high-molecular compound.

The chemically amplified resist according to the present invention behaves in one of the positive mode and the negative mode depending upon the ratio of copolymerization, i.e., x:y:z (see the general formula (2) and additives. For example, when the polymer expressed by the general formula (2) is regulated in such a manner that all of x, y and z are not zero, i.e., x=0.4, y=0.3, z=0.3 by way of example, each of $R^1$, $R^3$, $R^4$ and $R^6$ is a hydrogen atom, m, n, i and k are zero, each of $R^2$, $R^5$ and $R^7$ is tetracyclo $[4.4.0.1^{2,5}.1^{7,10}]$dodecanediyl group and $R^8$ is tetrahydropyran-2-il group, a derivative of sulfonium salt expressed by the general formula (4) such as, for example, cyclohexylmethyl(2-oxocyclohexyl) sulfoniumtrifluoromethansulfonato at 3 percent by weight serves as the photoacid generator, and makes the chemically amplified resist behave in positive mode. In this instance, when the chemically amplified positive resist is exposed to light, it generates acid, and the acid decomposes $R^8$ so as to invert the polarity of the resist. As a result, the exposed portion of the chemically amplified resist becomes soluble in alkaline developing solution. Thus, the chemically amplified resist serves as positive resist.

On the contrary, if a cross linking agent is added to the chemically amplified resist, which contains the photoacid generator and the polymer or resin, the photoacid causes the cross linking agent to bridge the polymer, and the chemically amplified resist behaves in the negative mode. For example, in the polymer expressed by the general formula (2), when z is 0, x and y are, by way of example, 0.5 and 0.5, each of $R^1$, $R^3$, $R^4$ and $R^6$ is a hydrogen atom, m, n, i and k are zero, $R^2$ is tricyclo$[5.2.1.0^{2,6}]$decanediyl group and $R^7$ are tetracyclo$[4.4.0.1^{2,5}.1^{7,10}]$dodecanediyl group and $R^8$ is tetrahydropyran-2-il group, the cross linking agent of hexamethoxymethylolmelamine is added to the polymer at 10 percent by weight with respect to the total amount, and the photoacid generator of a derivative of sulfonium salt expressed by the general formula (4) such as cyclohexymethyl(2-oxocyclohexyl) sulfoniumtrifluoromethansulfonato is further added to the polymer at 2 percent by weight with respect to the total amount. Then, the chemically amplified resist behaves as a negative resist. When the chemically amplified negative resist is exposed to light, the photoacid reacts with the hexamethoxymethylolmelamine so as to promote the bridging in the polymer. The cross linking agent decreases the solubility of the polymer exposed to the light through the bridging, and the non-exposed portion remains soluble in the developing solution. Thus, the chemically amplified resist behaves in the negative mode.

Any cross linking agent is available for the chemically amplified negative resist according to the present invention in so far as the cross linking agent is well mixed with the polymer expressed by the general formulae (1) and/or (2), is dissolved in cast solvent and promotes the bridging in the polymer at high speed. More than one cross linking agents may be incorporated in the chemically amplified negative resist. The cross linking agents available for the negative resist are, by way of example, melamine compound such as, for example, hexamethoxymethylolmelamine, urea compound such as, for example, dimethoxymethylethyleneurea and isocyanulato compound such as, for example, tris(2-hydroxyethylisocyanulato). These compounds do not set a limit on the cross linking agent available for the chemically amplified negative resist according to the present invention.

As described hereinbefore, the chemically amplified resist according to the present invention is used in the positive mode and the negative mode. The ratio of copolymerization x/y/z and additives determines the mode of the chemically amplified resist. For example, when using the chemically amplified resist in the positive mode, zero is never given to each of "x", "y" and "z".

For example, the chemically amplified resist is operative in the positive mode under the conditions where the resin expressed by the general formula (1) has "x", of 0.4, "y" of 0.3, "z" of 0.3, a hydrogen atom for each of $R^1$, $R^3$, $R^4$ and $R^6$, zero for each of "m", "n", "i" and "k", tetra-cyclo $[4.4.0.1^{2,5}.1^{7,10}]$dodecandiyl group for $R^2$, $R^5$ and $R^7$ and tetrahydropyran-2-il group for $R^8$ and that the photoacid generator expressed by the general formula of (4) is a derivative of sulfonium salt such as, for example, cyclohexylmethyl(2-oxocyclohexyl) sulfoniumtrifluoromethansulfonite mixed at 3 percent by weight with respect to the total weight, by way of example. The chemically amplified positive resist generates acid under exposure to light, and the acid decomposes the group $R^8$. Then, the resin changes the polarity, and the chemically amplified positive resist becomes soluble in a developer of alkaline water solution.

On the other hand, when a cross linking agent is added to the resin together with the photoacid generator, the chemically amplified resist is operative in the negative mode. The cross linking agent initiates the bridging in the presence of acid. The resin expressed by the general formula (2) may have z=0, x=0.5, y=0.5, a hydrogen atom for each of $R^1$, $R^3$, $R^4$ and $R^6$, zero for each of "m", "n", "i" and "k", tricyclo $[5.2.1.0^{2,6}]$decandiyl group for $R^2$ and tetracyclo$[4.4.0.1^{2,5}.1^{7,10}]$dodecandiyl group for $R^7$, and the cross linking compound may be hexamethoxymethylolmelamine at 10 weight percent with respect to the total weight. The photoacid generator may be a derivative of sulfonium salt expressed by the general formula (4) such as cyclohexylmethyl(2-oxocyclohxyl) sulfoniumtrifluoromethanesulfonato at 2 percent by weight with respect to the total weight. When the chemically amplified negative resist is exposed to light, photoacid generator supplies acid to hexamethoxymethylolmelamine, and the cross linking agent promotes the bridging to the polymer. Then, the chemically amplified negative resist becomes less soluble in the developing solution, and non-exposed part of the chemically amplified negative resist forms a negative resist pattern.

Any cross linking agent is available for the chemically amplified negative resist in so far as the cross linking agent is well mixed with the resin, well dissolved in the case solvent and initiates the bridging in the presence of acid. More than one cross linking agent may be incorporated in the chemically amplified negative resist according to the present invention. The cross linking agent available for the chemically amplified negative resist according to the present invention may be hexamethoxymethylolmelamine, methylolurea, dimethylated methylolurea, diethylated methylolurea, diisobuthylated methylolurea, di-β-oxopropylated methylolurea, 1,3-bis(hydroxymethyl) ethylene urea, 1,3-bis(hydroxymethyl)ethyleneurea, 1,3-bis (methoxymethyl)ethyleneurea, 1,3-bis(ethoxymethyl) ethyleneurea, 1,3-bis(isobuthoxymethyl)ethyleneurea, 1,3-bis(β-oxopropoxymethyl)ethyleneurea, 1,3-bis (hydroxmethyl)-4,5-bis(hydroxy)ethyleneurea, 1-3-bis (hydroxymethyl)-4,5-bis(hydroxy)ethyleneurea, 1,3-bis (methoxymethyl)-4,5-bis(methoxy)ethyleneurea, 1,3-bis-(ethoxymethyl)-4,5-bis-(ethoxy)ethyleneurea, 1,3-bis (osopropoxymethyl)-4,5-bis(isopropoxy)ethyleneurea, 1,3-bis(tert-buthoxymethyl)-4,5-bis(tert-buthoxy)ethyleneure, 1,3-bis($\beta$-oxopropoxymethyl)-4,5-bis($\beta$-oxopropoxy)4-5-bis($\beta$-oxopropoxy)ethyleneurea, 1,3-bis(hydroxymethyl)-tetra-hydro-2(1H)pyrimidinon, dimethylated 1,3-bis (hydroxymethyl)-tetrahydro-2(1H)pyrimidinon, diethylated 1,3-bis(hydroxymethyl)-tetrahydro-2(1H)pyrimidinon or butylated 1,3-bis(hydroxymethyl)-tetrahydro-2(1H) pyrimidinon. The following compound is also used as the cross linking agent: dimethyloluron, 1,3-bis (hydroxymethyl)-tetrahydro-5-hydroxy-2(H)pyrimidinon, 1,3,4,6-tetraxys(hydroxymethyl)glycolurl (which is identical with 1,3,4,6-tetraxys(hydroxymethyl)acetylene urea), tetramethylol creoxazolediurein 1,3,4,6-tetrazys (hydroxymethyl)glycoluril, 1,3,4,6-tetraxys (methoxymethyl)glycoluril, 1,3,4,6-tetraxys(ethoymethyl) glycoluril, 1,3,4,6-tetraxys(isobuthoxymethyl)glycoluril and 1,3,4,6-tetraxys($\beta$-oxopropoxymethyl)glycoluril. Isocyanurato compound such as tris(2-hydroxyethylisocyanurate) is also available for the chemically amplified resist as the cross linking agent.

The compound for bridging in the presence of acid selectively forms a bond to compound having hydroxyl group. For this reason, when $R^3$ of the resin according to the present invention is hydrogen, the bridging proceeds at high speed. In the chemically amplified negative resist, if $R^3$ is the hydrogen atom, it is preferable to have large "x" in the general formula (2).

When the compound with more than one hydroxyl group is added to the photo-sensitive resin compound, the chemically amplified resist achieves high dense cross linking structure after exposure to active light. Bridge hydro-carbon compound with the hydroxyl group or aromatic hydrocarbon compound with hydroxyl group are examples of the compound with more than one hydroxyl group. Some examples are bridged hydrocarbon compound such as 2,3-dihydroxy5 (6)-hydroxmethylnorbornen, 3,4,8,(9)-trihydroxytricyclodecane, 2-hydroxy-5(6)-(1',2'-dihydroxyethyl) norbornen and 2-hydroxy-5,6-bishydroxymethylnorbornen and catechol.

The ratio of copolymerization, i.e., x:y:z affects the solubility of the resultant polymer in developing solution. In the polymer available for the chemically amplified resist, x ranges from 0.05 to 0.75, y and z do not concurrently take zero, y ranges from zero to 0.8, and z ranges from zero to 0.6. More preferably, x ranges from 0.2 to 0.7, y ranges from zero to 0.5 and z ranges from zero to 0.45. The present inventors determined the preferable ranges of x,y and z through investigation of influence of x on the dissolution velocity. For example, in case where z was zero the compound suffixed with "x" was tricyclodecanediolmonoacrylate, i.e., $R^1$, $R^3$, $R^{2,}$ m and n were a hydrogen atom, a hydrogen atom, tricyclodecanediyl group, zero and zero in the general formula (2), respectively, and the compound suffixed with "y" was carboxytetracyclodecene, i.e., $R^4$, I and $R^5$ were a hydrogen atom, zero and tetracyclododecanediyl group in the general formula (2), respectively, even though x was changed from zero to 0.75, the polymer was dissolved in alkaline developing solution containing tetramethylammoniumhydroxyd at 2.38 percent at 0.7 micron per second to 4 micron per second. Thus, the dissolving velocity was acceptable in the lithography. However, if x was increased to 0.8, the dissolving velocity was decreased to $3 \times 10^{-5}$ micron per second. Thus, the upper limit of the preferable range for "x" was 0.75.

Any organic solvent is available for the chemically amplified resist according to the present invention in so far as the high-molecular compound and the other compounds such as alkylsulfonium salt are well dissolved therein and the resultant solution is uniformly spread by means of a spin coater. More than one kind of organic solvent may be mixed. The organic solvent available for the chemically amplified resist according to the present invention is, by way of example, n-propyl alcohol, iso-propyl alcohol, n-butyl alcohol, tert-butyl alcohol, methyl cellosolve acetato, ethyl cellosolve acetato, propylen glycol monoethylether acetate, lactic acid methyl, lactic acid ethyl, acetic acid 2-methoxybutyl, acetic acid 2-ethoxyethyl, pyruvic acid methyl, pyruvic acid ethyl, 3-methoxy methyl propionate, 3-methoxy ethyl propionate, N-methyl-2-oyrrolidinone, cyclohexanone, cyclopetanone, cyclohexanol, methyl ethyl ketone, 1,4-dioxan, ethyleneglycolmonomethylether, ethyleneglycolmonoisoproylether, diethyleneglycolmonomethylether or diethyleneglicoldimethylether. These kinds of solvent does not set a limit on the organic solvent available for the chemically amplified resist.

As described hereinbefore, the indispensable components of the chemically amplified resist according to the present invention are alkylsulfonium salt compound, the high-molecular compound and the solvent, and the chemically amplified negative resist further contains the cross linking agent. Other additives may be further incorporated in the chemically amplified resist according to the present invention. Examples of the additives are, by way of example, a surface active agent, a coloring agent or agents, a stabilizer, a coating property modifier and pigment.

Latent image in the chemically amplified resist according to the present invention is developed in developing solution selected from organic solvent, mixture of the organic solvent, alkaline solution of appropriate concentration, water solution and mixture thereof depending upon the solubility of the high-molecular compound.

Examples of the organic solvent are ketone family such as acetone, methyl ethyl ketone, methyl iso-butyl ketone, cyclopentanone and cyclohexanone, alcohol family such as methyl alcohol, ethyl alcohol, n-propyl alcohol, isopropyl alcohol, n-butyl alcohol, isobutyl alcohol, tert-butyl alcohol, cyclopentanol and cyclohexanol, tetrahydrofuran, dioxan, ethyl acetate, butyl acetate, isoamyl, benzene, toluene, xylene, and phenol.

Examples of an alkaline solution are inorganic alkaline family such as sodium hydroxide, potassium hydroxide and sodium silicate, organic amine family such a ethyl amine, propyl amine, diethyl amine, dipropyl amine, trimethyl amine and triethyl amine, water solution of organic ammonium salt such as tetramethylammoniumhydroxyde, tetraethylammoniumhydroxyde, trimethylhydroxymethylammoniumhydroxyde, triethylhydroxymethylammoniumhydroxyde and trimethylhydroxyethylammoniumhydroxyde, organic solvent and mixture thereof. However, these examples do not set a limit on the alkaline solution.

DESCRIPTION OF THE PREFERRED EMBODIMENT

Monomers

FIRST EXAMPLE

Synthesis of norbornandiolmethacrylate [dihydrohexyheptane-monomethacrylate] was carried out as follows:

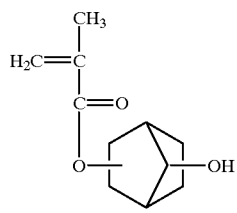

The synthesizing process was taught by K. Heyns et al. in Chemishe Verihite, volume 105, page 1019, 1972 or by J. B. Lambert et al. in Journal of the American Chemical Society, volume 100, page 2501. A drying tube of calcium chloride, a constant-pressure dropping funnel and a four-port 500 milli-litter flask with a thermometer were assembled, and norbornane-2,3-diol of 12.8 grams (which was equivalent to 100 milli-mole), dry triethylamine of 10.1 grams (which was equivalent to 100 milli-mole) and dry tetrahydrofuran of 200 millilitter were agitated in the flask so as to obtain uniform solution. The solution is cooled in iced water.

Methacryloyl chloride of 10.4 grams equivalent to 100 milli-mole was dissolved in dry tetrahydrofuran of 50 milli-litter, and put the solution in the dropping funnel. While the solution was being strongly agitated in the flask by using a teflon bar, the solution was dropped from the dropping funnel into the flask. The methacryloyl chloride was manu-factured by Tokyo Kasei Corporation. The solution was agitated in the flask, and reacted therewith in iced water for an hour and, (thereafter, at room temperature for ten hours.

The precipitate was filtered, and the solvent was elimi-nated from the filtrate in vacuum. The residue was dissolved in chloroform of 500 milli-litter, and the solution was treated with 0.5N hydrochloric acid, saturated water solution of salt, 3% water solution of sodium bicarbonate and saturated water solution of salt in this order. The chloroform layer was dehydrated by using magnesium sulfate, and, thereafter, was filtrated. The solvent was removed by using an evaporator, and the residue was separated and refined with a silica gel column. Thus, the objective compound was obtained, and the yield was 25 percent.

An IR analyzer IR-470 and an H-NMR analyzer of AMX-400 were prepared, and were manufactured by Shi-mazu manufacturing Corporation and Bruker Instruments Inc., respectively. The objective compound of 3.5 grams at yield of 18 percent was analyzed, and the analysis report was as follows.

Elemental Analysis Report (percent by weight) C: 68.30 (68.38) H: 10.61 (10.59).

The value in parentheses was calculated value of $C_{13}H_{24}O_3$ (the molecular weight of which was 228.3308).

IR(cm$^{-1}$):3350 ($v_{OH}$),1725($v_{c=O}$),1630($v_{c=c}$).

NMR(CDCl$_3$, Internal Reference Material:tetramethylsilane)ppm: 1.0–2.3 (m, 11H), 3.8 (m,1H), 4.8 (m,1H), 5.6 (m,1H), 6.1 (m,1H).

SECOND EXAMPLE

Tricyclodecanedimethanolmethacrylate was synthesized as follows:

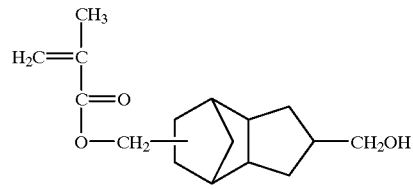

A drying tube of calcuim chloride a constant-pressure dropping funnel and a four-port 500 milli-litter flask with a theromether were assembled, and following compounds were agitated in the flask so as to obtain uniform solution.

tricyclodecane-4,8-dimethanol: 19.6 grams equivalent to 100 milli-mole manufactured by Aldrich Chemical Company Inc. (U.S.A.), lot number: B4,590-9 dry triethylamine: 10.1 grams equivalent to 100 milli-mole dry tetrahydrofuran: 200 millilitter The solution was cooled in iced water. Methacryloyl chloride of 10.4 grams equivalent to 100 milli-mole was dissolved in dry tetrahydrofuran of 50 milli-litter, and put the solution in the dropping funnel. While the solution in the flask was being strongly agitated by using a teflon bar, the solution was dropped from the dropping funnel into the flask. The methacryloyl chloride was manufactured by Tokyo Kasei Corporation. The solution was agitated in the flask, and reacted therewith in iced water for an hour and, thereafter, at room temperature for ten hours.

The precipitate was filtered, and the solvent was elimi-nated from the filtrate in vacuum. The residue was dissolved in chloroform of 500 milli-litter, and the solution was treated with 0.5N hydrochloric acid, saturated water solution of salt, 3% water solution of sodium bicarbonate and saturated water solution of salt in this order. The chloroform layer was dehydrated by using magnesium sulfate, and, thereafter, was filtrated. The solvent was removed by using an evaporator, and the residue was separated and refined with a silica gel column. Thus the objective compound was obtained, and the yield was 25 percent.

An IR analyzer IR-470 and an H-NMR analyzer of AMX-400 were prepared, and were manufactured by Shi-mazu Manufacturing Corporation and Bruker Instruments Inc., respectively. The objective compound was analyzed, and the analysis report was as follows.

Elemental Analysis Report (percent by weight) C: 73.6 (73.43) H: 10.2 (10.27).

The value in parentheses was calculated value of $C_{18}H_{30}O_3$ (the molecular weight of which was 294.4332).

IR(cm$^{-1}$):3350 ($v_{OH}$),1720($v_{c=O}$) 1640($v_{c=c}$).

NMR(CDCl$_3$, Internal Reference Material:tetramethylsilane)ppm: 0.9–2.1 (m, 17H), 3.2 (s, 2H), 3.9 (s,2H), 4.3–4.5 (s,1H), 5.6 (m, 1H), 6.1 (m, 1H).

THIRD EXAMPLE

Tricyclodecanedimethanolmonoacrylate was synthesized as follows:

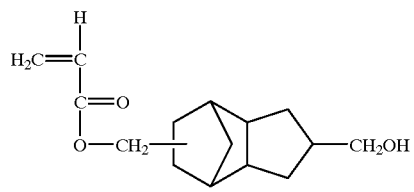

Using the acyloyl chloride of 10.4 grams equivalent to 100 milli-mole instead of methacyloyl chloride, tricyclodecanedimethanolmonoacrylate was synthesized as similar to the tricyclodecanedimethanolmonomethacrylate implementing the second example. The yield was 5.0 grams at 20 percent.

$^1$H-NMR (CDCI$_3$, Internal Reference Material: tetramethylsilane): 0.8–2.45 (m 14H), 3.2–3.35 (w, 2H), 3.6–3.85 (w,2H), 5.45–5.55 (w,1H), 6–6.05 (w, 1H).

Elemental Analysis Report (percent by weight) C: 72.8 (72.82) H: 10.1 (10.06).

The value in parentheses was calculated value of C$_{17}$H$_{28}$O$_3$ (the molecular weight of which was 280.4064).

IR(cm$^{-1}$):3350($v_{OH}$),1725($v_{c=o}$),1630($v_{c=c}$).

NMR (CDCI$_3$,Internal Reference Material:tetramethylsilane)ppm: 0.9–2.1 (m, 14H), 3.2 (s, 2H), 3.8 (s,2H), 5.6–6.4 (m, 3H).

FOURTH EXAMPLE

Tricyclodecanediolmonmethacylate was synthesized as follows:

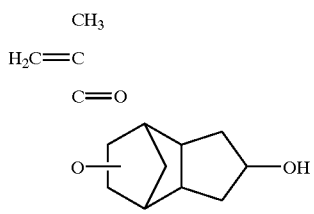

Hydroxytriclodecen of 50 grams was dissolved in methylene chloride in a 500 milli-litter eggplant type flask. 2,3 H-dihydropyran of 42 grams and toluene-sulfonic acid pyridine salt of 1.6 grams were added to the solution, and left the solution as it was for five hours. The resultant material was dissolved in diethylether of 300 milli-litter, and, thereafter, was washed in 2.5 weight % solution hydroxide water solution three times and in water three times. The resultant material was dried on magnesium sulfate through one night, and, thereafter, the solvent was removed by using an evaporator. Then, we obtained tetrahydropyranyloxytricyclodecen of 76.36 grams.

A dropping funnel was assembled with a 500 milli-litter four port flask. Hydroxytricyclodecen of 70 grams equivalent to 0.3 mole was dissolved in dry THF solution of 100 milli-litter in the flask, and was cooled in iced water. 1M hexane solution of borantetrahydrofuran complex was prepared, and was dropped from the dropping funnel into the flask in argon ambience by 150 milli-litter. After the dropping, the resultant solution was agitated in iced water for 30 minutes and at room temperature for 3 hours.

Subsequently, the resultant solution was cooled in iced water, again, and water of 24 milli-litter, 3M sodium hydroxide water solution of 54 milli-litter 30% H$_2$O$_2$ water solution of 36 milli-litter were successively dropped thereinto. The resultant solution was agitated in room temperature for 2 hours, and diethylether of 300 milli-litter was added. The resultant material was washed in saturated water solution of salt five times. Ether layer was separated, and the resultant material was dried on magnesium sulfate through one night. The solevent was removed, and we obtained tetrahydropyranyloxytetracyclodecanol of 71 grams.

A 300 milli-litter four port flask equipped with a condenser was prepared, and tetrapyranyloxytetracyclodecanol of 50 grams equivalent to 0.198 mole and dry pyripyridine of 20 grams were dissolved in dry tetrahydrofuran of 200 milli-litter in argon ambience, and the solution was cooled in iced water. Methacryloyl chloride was dropped into the solution by 21 milli-litter, and was agitated at ice temperature for an hour and at room temperature for 3 hours. Diethylether of 300 milli-litter was added, and the resultant material was washed in 2.5% sodium hydroxide water solution three times, in 2% water solution of hydrochloric acid twice and in water three times. The ether layer was dried on magnesium sulfate through one night. The solvent was removed in vacuum, and the resultant material was treated through column refining. The flow out solvent was hexane and methyl acetate regulated to 2:1. Then, we obtained tetrahydropyranyloxytricyclodecylmethacrylate of 52 grams.

A 500 milli-litter eggplant type flask equipped with reflex condenser was prepared. Tetrahydropyranyloxytricyclodesylmethacrylate of 50 grams equivalent to 0.155 mole was dissolved in ethanol of 150 milli-litter in the flask. Toluen sulfonic acid of 0.5 gram was added to the solution, and the resultant material was heated for 3 hours. The resultant material was dissolved in diethylether of 300 milli-litter, and, thereafter, was washed in 2.5% water solution of sodium hydroxide three times and in water three times. The resultant material was dried on magnesium sulfate through one night, and the solvent was removed. We obtained hydroxytricyclodecanylmethacrylate of 29 grams. The yield was 80 percent.

Elemental Analysis Report (percent by weight) C: 71.2 (71.39) H: 9.7 (9.59).

The value in parentheses was calculated value C$_{15}$H$_{24}$O$_3$ (the molecular weight of which was 252,3528).

$^1$H-NMR (CDCl$_3$, Internal Reference Material:tetramethylsilane): 0.95–2.5 (m 12H), 3.2–3.35 (s, 1H), 3.6–3.85 (m, 1H), 4.5–4.8 (m, 1H), 5.48–5.55 (w, 1H), 6–6.05 (w, 1H).

FIFTH EXAMPLE

Tetracyclododecandiolmonomethacrylate was synthesized as follows:

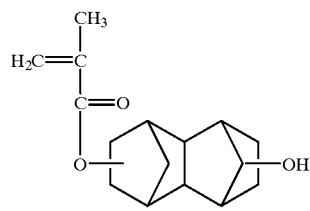

5-norbornene-2-isacetate, which was assigned product number 10774-3 manufactured by Aldrich Corporation, of 50 grams reacted with dicyclopentadien of 87 grams and methylhydroquinone of 0.137 gram at 170 degrees to 180 degrees in centigrade for 15 hours. The reaction product was distillated in vacuum, and we obtained 3-tetracyclo[4.4.0.1$^{2,5}$.1$^{7,10}$]dodecen-8-iracetate of 17.5 grams, and the boiling point was 120 degrees to 121 degrees in centigrade under 2 mmHg.

3-tetracyclo[4.4.0.1$^{2,5}$.1$^{7,10}$]dodecen-8-iracetate of 35 grams was dissolved in dry THF of 70 milli-litter, and the solution was cooled at 0 degrees in centigrade. The system of reaction was placed in argon ambience, and 1MTHF solution of boran THF complex was dropped into the solution by 96 milli-litter. The reaction was continued for an hour at 0 degree in centigrade and, thereafter, at room temperature for an hour. The resultant material was cooled to 0 degrees in centigrade, and water, water solution of NaOH at 3 mole/l and 30% $H_2O_2$ were successively dropped by 13.3 milli-litter, 29.5 milli-litter and 19.9 milli-litter. The reaction was continued at room temperature for 1.5 hours and sodium chloride was added so as to saturate water with the sodium chloride. The water layer was separated, and the organic layer was dried with magnesium sulfate. The solvent was removed in vacuum. Then, we obtained hydroxy-tetracyclo[4.4.0.1$^{2,5}$.1$^{7,10}$]dodecen-8-iracetate of 36.8 grams.

Subsequently, hydroxy-tetracyclo[4.4.0.1$^{2,5}$.1$^{7,10}$]dodecen-8-iracetate of 36.8 grams was dissolved in 95% ethanol of 110 milli-litter, and potassium hydroxide of 15.4 grams was added. The resultant material was heated and circulated. After cooling, the solvent was removed in vacuum, and water of 200 milli-litter and either of 200 milli-litter were added. Water was separated, and the organic layer was washed in saturated water solution of salt and water, successively. The resultant material was dried with magnesium sulfate. When the solvent was removed in vacuum, solid-state white compound was obtained, and was tetracyclo[4.4.0.1$^{2,5}$.1$^{7,10}$]dodecandiol of 12 grams.

Subsequently, tetracyclo[4.4.0.1$^{2,5}$.1$^{7,10}$]dodecandiol of 12 grams, pyridine of 4.89 grams and phenothiazine of 20 milligrams were dissolved in dry THF of 70 milli-litter, and the solution was cooled to 0 degrees in centigrade. Methacryloyl chloride of 6.46 grams was dissolved in dry THF of 20 milli-litter, and the solution was dropped thereinto. The reaction was continued for an hour at 0 degree in centigrade and, thereafter, at room temperature through one night. Pyridine hydrochloride salt was filtered from the solution, and the filtrate was distillated in vacuum. The condensate was diluted in ether of 150 milli-litter, and thereafter, washed in 0.5 N hydrochloric acid, saturated water solution of salt, 3% water solution of sodium dicarbonate, saturated water solution of salt and water in this order. The resultant organic layer was dried with magnesium sulfate, and ether was distilled away. The resultant material was separated and refined by using a silica gel column. The flow-out solvent was hexane and ethyl acetate regulated to 2:1. Then, we obtained the objective material of 6 grams in the form of viscous liquid.

Elemental Analysis Report (percent by weight) C: 73.1 (73.43) H: 10.4 (10.27).

The value in parentheses was calculated value of $C_{18}H_{30}O_3$ (the molecular weight of which was 294.4332).

$^1$H-NMR (CDCl$_3$) δ 0.64–1.83 (7H,m), 1.91 (3H,s), 1.95–2.6(7H,m), 4.04–4.24 (1H,m), 4.99(1H,br), 5.52(1H, s), 6.05(1H,s); IR(cm$^{-1}$): 3420 ($v_{OH}$),2950, 2890 ($v_{CH}$), 1714 ($v_{c=o}$), 1630 ($v_{c=c}$), 1165 ($v_{c-o}$).

SIXTH EXAMPLE

Hexacycloheptadecandiolmonomethacrylate was synthesized as follows.

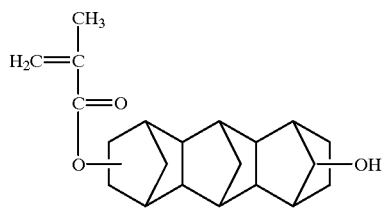

8-methoxycalbonyltetracyclo[4.4.0.1$^{2,5}$.1$^{17,10}$]-3-dodecen of 65 grams and dicyclopentadien of 87 grams and methylhydroquinon of 0.14 grams were put into a 300 milli-liter eggplant type flask, and reacted at 170 degrees to 180 degrees in centigrade for 17 hours. The reaction product was cooled, and 8-methoxycalbonyltetracyclo [4.4.0.1$^{2,5}$.1$^{17,10}$]-3-dodecen and dicyclopentadien were eliminated from the reaction product through the distillation in vacuum. Hot methanol was added to the residue, and insoluble content was filtrated. The filtrate was condensated in vacuum. 12-methoxycalbonil-hexacyclo[6.6.1.1$^{3,6}$.1$^{10,13}$.0$^{2,7}$.0$^{9,14}$] heptadecen of 10 grams was recrystalized from the residue in methanol.

12-methoxycalbonil-hexacyclo[6.6.1.1$^{3,6}$.1$^{10,13}$.0$^{2,7}$.0$^{9,14}$]heptadecen of 3.6 grams was dissolved in 95% ethanol of 30 milli-litter, and potassium hydroxide of 1.25 grams was added to the solution. The resultant material was heated and circulated for 2 hours. Thereafter, the resultant material was cooled, and was condensed to a third by using an evaporator. Water of 50 milli-litter and ether of 50 milli-litter were added thereto so as to separate water component. 3% HCl was added to the water so as to change it to acidic. Then, white precipitate was obtained, and was filtrated. The white precipitate was washed in water so as to neutralize it, and we obtained 12-calboxyhexacyclo[6.6.1.1$^{3,6}$.1$^{10,13}$.0$^{2,7}$.0$^{9,14}$] heptadecen of 2.2 grams.

Subsequently, 12-calboxyhexacyclo[6.6.1.1$^{3,6}$.1$^{10,13}$.0$^{2,7}$.0$^{9,14}$]heptadecen of 2.1 grams and 3,4-dihydro-2H-pyran of 1.71 grams were dissolved in tetrahydrofuran of 50 milli-litter, and p-toluen-sulfonic acid of 0.03 gram was added to the solution. The reaction was continued at room temperature for 2 hours. The reaction product was diluted in ether of 100 milli-litter, and the resultant material was successively washed in 3% water solution of $Na_2CO_3$, saturated water solution of salt and water. The resultant organic layer was dried with MgSO$_4$. 3,4-dihydro-2H-pyran, which did not react with ether, was distilled away in vacuum by using an evaporator. Then, we obtained 12-tetrahydropyranyloxy-carbonilhexacyclo[6.6.1.1$^{3,6}$.1$^{10,13}$.0$^{2,7}$.0$^{9,14}$]heptadecen of 2 grams.

Subsequently, 12-tetrahydropyranyloxycarbonilhexacyclo[6.6.1.1$^{3,6}$.1$^{10,13}$.0$^{2,7}$.0$^{9,14}$]heptadecen of 2 grams was mixed in dry THF of 8 milli-litter, and was cooled to 0 degrees in centigrade. Solution of 1Mboran THF complex of 6 milli-litter was dropped thereinto. The resultant material was agitated at 0 degree in centigrade for an hour and, thereafter, at room temperature for an hour. The resultant material was cooled to 0 degree in centigrade, and water, water solution of 3MnaOH and 30% $H_2O_2$ were dropped into the resultant material at 20 degrees in centigrade or less by 0.5 milli-litter, 1.1 milli-litter and 0.7 milli-litter, respectively.

The resultant material was agitated at room temperature for 1.5 hours, and the water was saturated with NaCl. The resultant material was dried with MgSO$_4$, and ether was eliminated. Then, we obtained hydroxytetrahydropyraniloxycalbonil-hexacyclo[6.6.1.1$^{3,6}$.1$^{10,13}$.1$^{10,13}$.0$^{2,7}$.0$^{9,14}$]heptadecen of 1.8 grams.

Subsequently, hydroxy-tetrahydropyraniloxycalbonil-hexacyclo[6.6.1.1$^{3,6}$.1$^{10,13}$.0$^{2,7}$.0$^{9,14}$]heptadecen of 1.8 grams and pyridine of 0.48 gram were dissolved in dry THF of 4 milli-litter, and the resultant material was cooled to 0 degree in centigrade. Methacryloyl chloride of 0.63 grams was dissolved in THF of 1 milli-litter, and the solution was dropped into the resultant material. The agitation was carried out for an hour, and the reaction was continued at room temperature through one night. Pyridine hydrochloride salt was filtrated from the solution. The filtrate was diluted in ether of 20 milli-litter, and, thereafter, was washed in 0.5 N hydrochloric acid, saturated water solution of salt, 3% water solution of Na$_2$CO$_3$ and saturated water solution of salt in this order. The resultant organic layer was dried with magnesium sulfate, and ether was distilled away in vacuum. The residue was dissolved in solvent of 10 milli-litter, and the solvent was mixture of acetic acid/tetrahydrofuran/water regulated to 4:2:1. The reaction was continued at 40 degrees to 45 degrees in centigrade for an hour. The resultant solution was poured in iced water of 50 milli-litter. Then, white precipitate was produced. The white precipitate was filtrated, and was washed in water. The white precipitate was dried, and we obtained the objective material of 1 gram.

Elemental Analysis Report (percent by weight) C: 76.3 (76.62) H: 10.2 (10.06).

The value in parentheses was calculated value of C$_{23}$H$_{36}$O$_3$ (the molecular weight of which was 360.5356).

SEVENTH EXAMPLE

Octacyclodecocandiolmonomethacrylate was synthesized as follows.

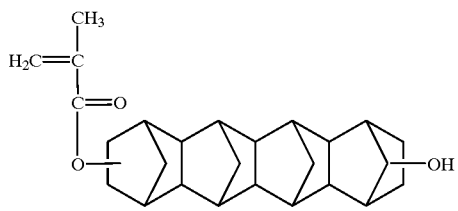

The synthesis was similar to that of the fifth example except for hexacycloheptadesenilacetate synthesized for the sixth example. Namely, the present inventors used hexacycloheptadesenilacetate instead of 5-norbornene-2-isoacetate.

Elemental Analysis Report (percent by weight) C: 78.5 (78.83) H: 9.7 (9.92).

The value in parentheses was calculated value of C$_{28}$H$_{42}$O$_3$ (the molecular weight of which was 426.638).

EIGHTH EXAMPLE

Carboxynorbornylmethacrylate was synthesized as follows.

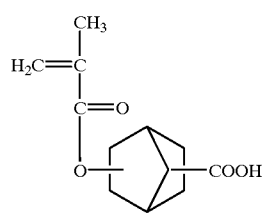

Bicyclo[2.2.1]hepto-5-ene-2-carboxylic acid tert-butylester of 50 grams and methacrylic acid of 133 grams are mixed with concentrated sulphuric acid of 1.35 grams and water of 2 grams in a 200 milli-litter three-port flask, and the reaction was continued at 60 degrees to 70 degrees in centigrade for five hours. The resultant material remained cooled, and the residual methacylic acid was distilled in vacuum. The residual material was separated and refined by using a silica gel column, and we obtained the objective compound of 2 grams.

Elemental Analysis Report (percent by weight) C: 65.7 (65.60) H: 9.7 (9.44).

The value in parentheses was calculated value of C$_{17}$H$_{24}$O$_4$ (the molecular weight of which was 256.3412).

IR(cm$^{-1}$):2400–3600($v_{OH}$), 2960–2880($v_{CH}$), 1704($v_{c=o}$), 1628 ($v_{c=c}$), 1168 ($v_{c-o}$).

$^1$H-NMR (CDCl$_3$, Internal Reference Material: tetramethylsilane) ppm: 1.25–2.05(6H),1.92(3H),2.3–2.85 (3H),4.69–4.74(1H), 5.53(1H),6.06(1H).

NINTH EXAMPLE

Carboxytricyclodecanedimethanolmonomethacylate was synthesized as follows.

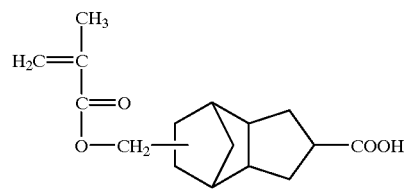

A 500 milli-litter four-port flask with a thermometer was assembled with a drying tube of calcium chloride and a constant-pressure dropping funnel. Tricyclo[5.2.1.0$^{2,6}$] decane-4,8-dimethanol, which is assigned product number B4,590–9 manufactured by Aldrich Chemical Company, Inc. in the U.S.A., of 50 grams equivalent to 0.25 mole and dry pyridine of 25.76 grams equivalent to 0.25 mole are mixed with dry tetrahydrofuran of 300 in the flask. The solution was agitated, and was cooled in iced water. Methacryloyl chloride, which was manufactured by Tokyo Kasei Corporation, of 26.53 grams equivalent to 0.25 mole was dissolved in dry tetrahydrofuran of 100 milli-litter, and the solution was dropped from the dropping funnel into the flask during strong agitation with a teflon bar.

After the dropping, the resultant material was agitated and cooled in iced water for an hour, and the reaction was continued at room temperature for ten hours. Precipitate was filtrated, and the filtrate was distilled in vacuum so as to eliminate the solvent therefrom. The residue was dissolved in methylen chloride of 500 milli-litter, and the solution was treated with 0.5N hydrochloric acid, saturated water solution of salt, 3% water solution of sodium bicarbonate and saturated water solution of salt in this order. Methylen chloride layer was dehydrated with magnesium sulfate, and the resultant material was filtrated. Solvent was eliminated by using an evaporator, and the residue was separated and refined by using a silica gel column. Then, we obtained viscous liquid of tricyclo[5.2.1.0$^{2,6}$]decane-4,8-dimethanol-monomethacrylate of 29.6 grams. The yield was 44 percent.

Subsequently, pyridium dichromate of 24.9 grams equivalent to 66.2 millimole was mixed with N,N-dimethylformamido of 40 milli-litter in a 100 milli-litter four-port flask, which was assembled with a drying tube of calcium chloride and a constant-pressure dropping funnel. After strong agitation so as to make the solution uniform, tricyclo[5.2.1.0$^{2,6}$]decane-4,8-dimethanolmonomethacrylate was dissolved in N,N-dimethylformamido of 10 milli-litter, and the solution was dropped into the flask. The reaction was continued at room temperature for 10 hours. The resultant solution was diluted in water of 500 milli-litter, and organic compound layer was extracted by using diethylether (150 milli-litter×3). Ether layer was dehydrated with magnesium sulfate, and the resultant material was filtrated. The solvent was removed by using an evaporator, and the residue was separated and refined by using a silica gel column. Then, we obtained the objective compound of 2.12 grams. The yield was 40 percent. Using the model IR-470 manufactured by Shimazu manufacturing Corporation and the model AXM-400 manufactured by Bruker Instruments Inc., the objective compound was analyzed.

Elemental Analysis Report (percent by weight) C: 70.0 (70.13) H: 9.05 (9.15).

The value in parentheses was calculated value of $C_{18}H_{28}O_4$ (the molecular weight of which was 308.4168)

IR(cm$^{-1}$):2400–3350 ($v_{OH}$), 2950 ($v_{OH}$), 1696 (vc=0), 1626 ($v_{c=c}$), 1166($v_{c-o}$).

$^1$H NMR (CDCl$_3$, Internal Reference Material: tetramethylsilane) ppm: 0.95–2.74(m, 14H), 1.95 (s, 3H), 3.88–4.17(m,2H), 5.55(d,J=1.5 Hz, 1H), 6.5(s,1H), 9.58–10.8(br s, 1H).

TENTH EXAMPLE

Carboxytetracyclodecenmethacrylate was synthesized as follows.

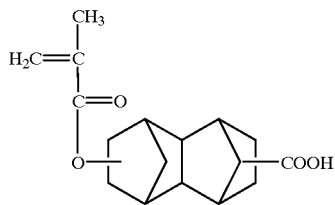

8-tertial-buthytoxycarboniltetracyclo[4.4.0.1$^{2,5}$.1$^{7,10}$]-3-dodecene of 10 grams was mixed with dry THF of 25 milli-litter in a 200 milli-litter four-port flask, and the resultant material was cooled to 0 degree in centigrade. The ambience was replaced with argon, and THF solution of 1M boran-THF complex was dropped into the flask by 20 milli-litter. The solution was agitated at 0 degrees in centigrade for an hour and at room temperature for an hour. The resultant material was cooled to 0 degree in centigrade, and water was dropped by 3 milli-litter. Moreover, 3M water solution of NaOH and 30% solution of $H_2O_2$ were dropped by 6.6 milli-litter and 4.3 milli-litter, respectively at 20 degrees or less. The solution was agitated at room temperature for 1.5 hours, and water was saturated with NaCl. The resultant material was diluted with ether of 100 milli-litter. The ether layer was washed in saturated water solution of salt and water, and the resultant material was dried with MgSO$_4$. The ether was distillated, and we obtained hydroxy-8-t-buthytoxycarboniltetracyclo[4.4.0.1$^{2,5}$.1$^{17,10}$]dodecane of 10 grams. The yield was 94 percent.

Subsequently, hydroxy-8-t-buthytoxycarboniltetracyclo [4.4.0.1$^{2,5}$.1$^{17,10}$]dodecane of 7.7 grams equivalent to 0.0276 mole and pyridine of 2.19 grams equivalent to 0.0276 mole were dissolved in dry THF of 40 milli-litter. The solution was cooled to 0 degree in centigrade. Chloride methacrylate of 289 grams equivalent to 0.0276 mole was dissolved in THF of 10 milli-litter, and the solution was dropped into the solution cooled to 0 degrees in centigrade. Agitation was carried out for an hour, and the reaction was continued at room temperature through one night. Pyridine hydrocyloride was separated and filtrated. The filtrate was concentrated, and was diluted in methylane chloride of 100 milli-litter. After the washing in 5% solution of hydrochloric acid, 3% solution of $Na_2CO_3$ and saturated water solution of salt in this order, the resultant material was dried with MgSO$_4$, and methylane chloride was distillated. The resultant material was separated through the column, and the hexane and ethyl acetate were regulated to 10:1. Then, we obtained t-buthoxycarboniltetracyclo[4.4.0.1$^{2,5}$.1$^{7,10}$] dodecanilmethacrylate of 4.5 grams. The yield was 47 percent.

Subsequently, the methacrylate of 3 grams thus obtained was dissolved in toluen of 20 millilitter, and ten drops of trifluoromethanesulfonic acid were added to the solution. The agitation was carried out at room temperature for 5 hours. The toluen layer was washed in saturated water of salt, and extraction was carried out by using 3% solution of NaCO$_3$. Hydrochloric acid was added to the water layer so as to change it to acid, and the organic layer was extracted by using ether. The resultant material was washed by using saturated water of salt and water, and was dried with MgSO$_4$. We obtained the objective material of 1.68 grams through the column refining using hexane and ethyl regulated to 1:1, and the yield was 67 percent.

Elemental Analysis Report (percent by weight) C: 70.56 (70.77) H: 9.22 (9.387).

The value in parentheses was calculated value of $C_{19}H_{30}O_4$ (the molecular weight of which was 324.4436).

$^1$H NMR (CDCl$_3$, Internal Reference Material: tetramethylsilane) ppm: 1.1–1.9(9H,m),2.1–2.7(6H,m),4.98 (1H,s),5.52(1H,s),6.05(1H,s),10.5–12.4(1H,br s).

IR(cm$^{-1}$):2800–3400($v_{OH}$),3048,2960($v_{CH}$),1710,1700 ($v_{c=0}$),1632($v_{c=c}$),1170($v_{c-o}$).

ELEVENTH EXAMPLE

Carboxyhexacycloheptadecanemethacrylate was synthesized as follows.

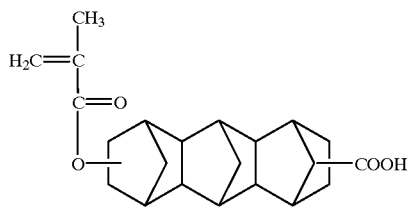

8-methoxycarboniltetracyclo[4.4.0.1$^{2,5}$.1$^{17,10}$]-3-dodecen of 65 grams, dicyclopentadien of 87 grams and methylhydroquinon of 0.14 gram were mixed in a 300 milli-litter eggplant type flask, and the reaction was continued at 170 degrees to 180 degrees in centigrade for 17 hours. The reaction product remained cooled, and residual 8-methoxycarboniltetracyclo[4.4.0.1$^{2,5}$.1$^{17,10}$]-3-dodecen and residual dicyclopentadien were distillated in vacuum. Hot methanol was added to the residue, and insoluble content was filtrated. The filtrate was concentrated in vacuum, and residue was recrystallized from methanol. Then, we obtained white crystal of 12-methoxycarbonilhexacyclo[6.6.1.1$^{3,6}$.1$^{10,13}$.0$^{2,7}$.0$^{9,14}$] heptadecen of 10 grams.

Subsequently, 12-methoxycarbonilhexacyclo[6.6.1.1$^{3,}$ $^{6}$.1$^{10,13}$.0$^{2,7}$.0$^{9,14}$]heptadecen of 3.6 grams was dissolved in 95% solution of ethanol of 30 milli-litter, and potassium hydroxide of 1.25 grams was added to the solution. The resultant material was heated and circulated, and, thereafter remained cooled for 2 hours. The solution was concentrated to a third by using an evaporator. Water of 50 milli-litter and ether of 50 milli-litter were added to the resultant material so as to separate water layer. 3% solution of hydrochloric acid was added to the water layer, and the water layer was changed to acid. Then, we obtained white precipitate. The white precipitate was filtrated, and was washed in water until it became neutral. Then, we obtained 12-carboxyhexacyclo [6.6.1.1$^{3,6}$.1$^{10,13}$.0$^{2,7}$.0$^{9,14}$]heptadecen of 2.2 grams.

Subsequently, carboxyhexacyclo[6.6.1.1$^{3,6}$.1$^{10,13}$.0$^{2,7}$.0$^{9,}$ $_{14}$]heptadecen of 2.1 grams and 3,4-dihydro-2H-pyran of 1.71 grams were dissolved in tetrahydrofuran of 50 milli-litter, and p-toluen sulfonic acid of 0.03 gram was added to the solution. The reaction was continued at room temperature for 2 hours. The resultant material was diluted in ether of 100 milli-litter, and was washed in 3% solution of Na$_2$CO$_3$, saturated water of salt and water in this order, and the organic layer was dried with MgSO$_4$. When ether and residual 3,4-dihydro-2H-pyran were removed in vacuum by using an evaporator, we obtained viscous-liquid of 12-tetrahydropyranyloxycarbonilhexacyclo[6.6.1.1$^{3,6}$.1$^{10,}$ $_{13}$.0$^{2,7}$.0$^{9,14}$]heptadecen of 2 grams.

Subsequently, 12-tetrahydropyranyloxycarbonilhexacyclo[6.6.1.1$^{3,6}$.1$^{10,}$ $_{13}$.0$^{2,7}$.0$^{9,14}$]heptadecen of 2 grams was dissolved in dry THF solution of 8 milli-litter, and was cooled to 0 degree in centigrade. The ambience was replaced with argon, and THF solution of 1M boran-THF complex was dropped by 6 milli-litter. The resultant material was agitated at zero degree in centigrade for an hour and at room temperature at an hour. Thereafter, the resultant material was cooled to 0 degree in centigrade, and water of 0.5 milli-litter was dropped thereinto. Moreover, 3M NaOH water solution and 30% solution of H$_2$O$_2$ were dropped by 1.1 milli-litter and 0.7 milli-litter at 20 degrees in centigrade or less. Agitation was carried out at room temperature for 1.5 hours, and NaCl saturated the water. The resultant material was diluted in ether of 100 milli-litter. The ether layer was washed in saturated water solution of salt and water, and was dried with MgSO$_4$. The ether was removed, and we obtained hydroxy-tetrahydropyraniloxycarbonilhexacyclo[6.6.1.1$^{3,6}$.1$^{10,13}$.0$^{2,}$ $_{7}$.0$^{9,14}$]heptadecen of 2 grams.

Subsequently, hydroxy-tetrahydropyraniloxycarbonilhexacyclo[6.6.1.1$^{3,6}$.1$^{10,13}$.0$^{2,}$ $_{7}$.0$^{9,14}$]heptadecen of 2 grams and pyridine of 0.53 gram were dissolved in dry THF solution of 8 milli-litter. After cooling it to zero degree in centigrade, methacryloylchlorid of 0.7 gram was dissolved in THF solution of 1 milli-litter, and the solution was dropped into the solution cooled to zero degree in centigrade. Agitation was carried out for an hour, and the reaction was continued at room temperature through one night. Pyridine hydrochloric acid was separated, and was filtrated. The filtrate was diluted in ether of 20 milli-litter, and the washing was repeated in 0.5 N hydrochloric acid, saturated water solution of salt, 3% solution of Na$_2$CO$_3$ and saturated water solution of salt in this order. The resultant material was dried with MgSO$_4$. The ether was distillated in vacuum, and the column separation was carried out by using hexan and ethyl acetate regulated to 5:1. Then, we obtained viscous-liquid of carboxyhexacyclo[6.6.1.1$^{3,}$ $_{6}$.1$^{10,13}$.0$^{2,7}$.0$^{9,14}$]heptadecanemethacrylate of 2 grams. The methacrylate of 2 grams was dissolved in mixture of acetic acid/tetrahydrofuran/water regulated to 4:2:1. The mixture was 14 milli-litter. The reaction was continued at 40 degrees to 45 degrees in centigrade for 45 minutes, and the solution was poured into iced water of 250 milli-litter. Separated crystal was filtrated, and was washed in water several times. We obtained the objective compound of 0.79 gram through washing in hexane.

Elemental Analysis Report (percent by weight) C: 73.98 (74.19) H: 9.11 (9.34).

The value in parentheses was calculated value of C$_{24}$H$_{36}$O$_4$ (the molecular weight of which was 388.5460).

$^1$H NMR (CDCl$_3$, Internal Reference Material: tetramethylsilane) ppm: 0.9–1.85(11H,m),1.91(3H,s), 1.92–2.8(9H,m),4.99(1H,s), 5.51(1H,s),6.04(1H,s),9.5–11.3 (1H,br).

IR (cm$^{-1}$):2800–3600($v_{OH}$),2950,3048($v_{CH}$),1712, ($v_{c=}$ $_o$),1634($v_{c=c}$),1172($v_{c-0}$).

TWELFTH EXAMPLE

Carboxyoctacyclodecosantmethacrylate was synthesized as follows.

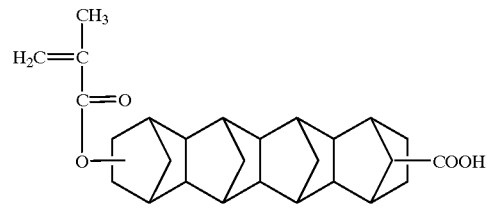

Carboxyoctacyclodocosantacylate was synthesized as similar to the eleventh example. In the synthesis, 8-methoxycarboniltetracyclo[4.4.0.1$^{2,5}$.1$^{17,10}$]-3-dodecen was replaced with the intermediate product in the eleventh example, i.e., 12-methoxycarbonilhexacyclo[6.6.1.1$^{3,6}$.1$^{10,}$ $_{13}$.0$^{2,7}$.0$^{9,14}$]heptadecen.

Elemental Analysis Report (percent by weight) c: 76.3 (76.61) H: 9.10 (9.31).

The value in parentheses was calculated value of C$_{29}$H$_{42}$O$_4$ (the molecular weight of which was 454.6484).

IR(cm$^{-1}$):3050,2940($v_{cH}$),1710,1715($v_{c=0}$),1636 ($v_{c=c}$), 1170($v_{c-0}$).

THIRTEENTH EXAMPLE

Vinyl monomer expressed by the general formula (6) was synthesized as follows. In the general formula (6), R$^6$ was a methyl group, R$^7$ was a tricyclo[5.2.1.0$^{2,6}$]decane-4,8-dil group, R$^8$ was a tert-butyl group and k was 1.

(6)

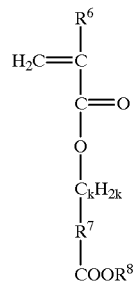

A 100 milli-litter round bottom flask was assembled with a drying tube of calcium chloride, and the vinyl monomer, which was synthesized in the ninth example, of 5 grams equivalent to 0.018 mole, methylane chloride of 30 milli-litter and t-butylalcohol of 3.99 grams equivalent to 0.054 mole and 4-dimethylamino pyridine of 1.76 grams equivalent to 0.014 mole were mixed in the round bottom flask. The mixture was cooled to 0 degree in centigrade. Dicyclohexycarbodimide of 4.08 grams equivalent to 0.02 mole was gradually added to the cooled mixture. Agitation was carried out at 0 degree in centigrade for 5 minutes and, thereafter, was continued at room temperature for 4 hours. Cyclohexylurea was separated and filtrated. The filtrate was washed in 0.5M hydrochloride acid (2×10 ml) and saturated water solution of sodium bicarbonate (2×10 ml) in this order. The organic layer was dehydrated with magnesium sulfate, and was filtrated. The solvent was removed by using an evaporator, and, thereafter, was refined through a silica gel column. Then, we obtained the objective compound of 5.67 grams in the form of viscous liquid. The yield was 90 percent.

Elemental Analysis Report (percent by weight) C: 71.4 (71.96) H: 9.4 (9.78).

The value in parentheses was calculated value of $C_{21}H_{34}O_4$ (the molecular weight of which was 350.4972).

IR (cm$^{-1}$):2950,2874($v_{CH}$),1716($v_{c=o}$),1626($v_{c=c}$),1166 ($v_{c-o}$).

FOURTEENTH EXAMPLE

Vinyl monomer expressed by the general formula (7) was synthesized as follows.

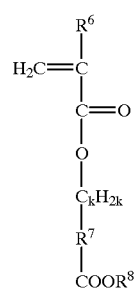

(7)

where $R^6$ was a methyl group, $R^7$ was a tricyclo[5.2.1.0$^{2,6}$] decane-4,8-dil group, $R^8$ was a tetrahydrofuran-2-il group and k was 1.

Using 2,3-dihydrofuran instead of t-buthylalcohol, the target monomer was synthesized. The target monomer was viscous liquid, and the yield was 62 percent.

Elemental Analysis Report (percent by weight) C: 68.9 (69.20) H: 8.3 (8.85).

The value in parentheses was calculated value of $C_{21}H_{32}O_5$ (the molecular weight of which was 364.4808).

IR(cm$^{-1}$):2950–2874($v_{CH}$),1718($v_{c=o}$),1630($v_{c=c}$),1166 ($v_{c-o}$).

$^1$H-NMR (CDCl$_3$, Internal Reference Material: tetramethylsilane) ppm: 1.1–2.8(m,18H),3.5–3.8(m,2H), 3.8–4.1(m,2H),5.6–6.5(m,4H).

FIFTEENTH EXAMPLE

Vinyl monomer expressed by the general formula (8) was synthesized as follows.

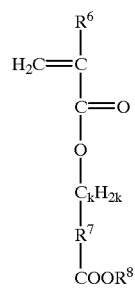

(8)

where $R^6$ was a methyl group, $R^7$ was a tricyclo[5.2.1.0$^{2,6}$] decane-4,8-dil group, $R^8$ was a tetrahydropyran-2-il group and k was 1.

A 200 milli-litter three-port flask with a thermometer was assembled with a drying tube of calcium chloride. The following vinyl monomer of 6 grams equivalent to 0.022 mole and 3,4-dihydro-2H-pyran of 4.54 grams equivalent to 0.054 mole were mixed with methylene chloride of 80 milli-litter, and the mixture was cooled with iced water. The vinyl monomer was synthesized in the twelfth example, and was expressed by the general formula (8) where $R^6$ was a methyl group, $R^7$ was a tricyclo[5.2.1.0$^{2,6}$]decane-4,8-dil group, $R^8$ was a hydrogen atom and k was 1.

P-toluensulufonic acid monohydrate of 20 milli-gram was added, and the mixture was agitated for 30 minutes. Upon completion of the reaction, the reaction product was diluted in diethylether of 120 milli-litter, and was successively washed in the saturated water solution of sodium bicarbonate of 80 milli-litter, saturated water solution of salt of 80 milli-litter and water of 150 milli-litter. The resultant organic layer was dehydrated with magnesium sulfate, and, thereafter, was filtrated. Using an evaporator, the solvent and residual 3,4-hydro-2H-pyran was removed, and we obtained the objective monomer of 6.59 grams. The objective monomer was viscous liquid, and the yield was 84 percent.

Elemental Analysis Report (percent by weight) C: 69.5 (69.81) H: 8.98 (9.05).

The value in parentheses was calculated value of $C_{22}H_{34}O_5$ (the molecular weight of which was 378.5076).

IR(cm$^{-1}$):2950,2870($v_{CH}$),1716($v_{c=o}$),1632($v_{c=c}$),1166 ($v_{c-o}$).

$^1$H-NMR (CDCl$_3$, Internal Reference Material: tetramethylsilane) ppm: 1.2–2.7(m,20H),1.95(s,3H), 3.47–3.57(m,1H),3.63–3.73(m,1H),3.8–4.1(m,2H),5.55(s, 1H),5.94(s,1H),6.1(s,1H).

SIXTEENTH EXAMPLE

Vinyl monomer expressed by the general formula (9) was synthesized as follows.

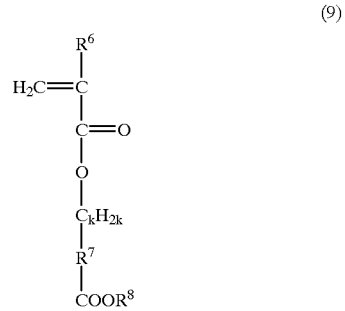

(9)

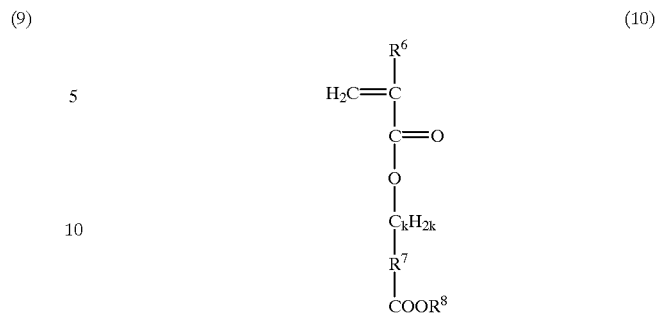

(10)

where $R^6$ was a methyl group, $R^7$ was a tricyclo[$5.2.1.0^{2,6}$] decane-4,8-dil group, $R^8$ was a 1-ethoxyethyl group and k was 1.

A 200 milli-litter three-port flask with a thermometer was assembled with a drying tube of calcium chloride. The following vinyl monomer of 6 grams equivalent to 0.022 mole and vinylethylether of 1.30 grams equivalent to 0.022 mole were mixed with methylene chloride of 60 milli-litter, and the mixture was cooled with iced water. The vinyl monomer was synthesized in the twelfth embodiment, and was expressed by the general formula (9) where $R^6$ was a methyl group, $R^7$ was a tricyclo[$5.2.1.0^{2,6}$]decane-4,8-dil group, $R^8$ was a hydrogen atom and k was 1.

P-toluensulufonic acid monohydrate of 15 milli-gram was added, and the mixture was agitated for an hour. Upon completion of the reaction, the reaction product was diluted in diethylether of 120 milli-litter, and was successively washed in the saturated water solution of sodium bicarbonate of 80 milli-litter, saturated water solution of salt of 80 milli-litter and water of 150 milli-litter. The resultant organic layer was dehydrated with magnesium sulfate, and thereafter, was filtrated. Using an evaporator, the solvent was removed, and we obtained the objective monomer of 5.67 grams. The objective monomer was viscous liquid, and the yield was 90 percent.

Elemental Analysis Report (percent by weight) C: 68.9 (68.82) H: 9.6 (9.35).

The value in parentheses was calculated value of $C_{21}H_{34}O_5$ (the molecular weight of which was 366.4966).

IR (cm$^{-1}$):2950,2872($v_{CH}$),1720($v_{c=0}$),1630($v_{c=c}$),1166 ($v_{c-0}$).

$^1$H NMR (CDCl$_3$, Internal Reference Material: tetramethylsilane) ppm: 1.0–2.7(m, 14H),1.2(t,3H),1.45(d, 3H),1.95(s,3H),3.75(q, 2H),3.8–4.1(m,2H),5.55(s,1H),5.9 (q,1H),6.1(s,1H).

SEVENTEENTH EXAMPLE

Vinyl monomer expressed by the general formula (10) was synthesized as follows.

where $R^6$ was a methyl group, R was a tricyclo[$5.2.1.0^{2,6}$] decane-4,8-dil group, $R^8$ was a 1-buthoxyethyl group and k was 1.

Using buthylvinylether instead of vinylethylether, we synthesized the monomer as similar to the sixteenth example. The objective monomer was viscous liquid, and the yield was 70 percent.

Elemental Analysis Report (percent by weight) C: 68.05 (67.29) H: 9.12 (9.33).

The value in parentheses was calculated value of $C_{23}H_{38}O_6$ (the molecular weight of which was 410.5496).

EIGHTEENTH EXAMPLE

Vinyl monomer expressed by the general formula (11) was synthesized as follows.

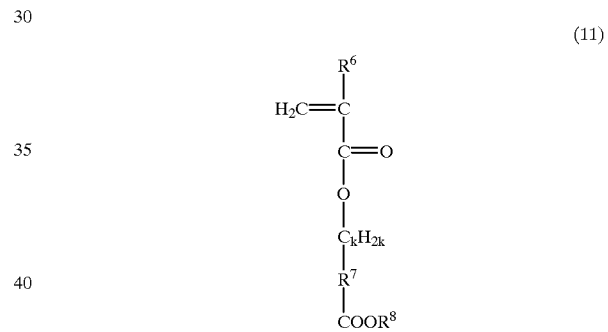

(11)

where $R^6$ was a methyl group, $R^7$ was a tetracyclo[$4.4.0.1^{2,} 5.1^{7,10}$]dodecanediyl group, $R^8$ was a tert-buthyl group and k was 0.

A 100 milli-litter round bottom flask with a thermometer was assembled with a drying tube of calcium chloride. Vinyl monomer of 5 grams equivalent to 0.018 mole, methylene chloride of 30 milli-litter, t-buthyl alcohol of 3.99 grams equivalent to 0.054 mole and 4-dimethylaminopyridine of 1.76 grams equivalent to 0.014 mole were mixed in the flask, and the mixture was cooled with iced water. The vinyl monomer was synthesized for the tenth example.

Dicyclohexylcarbodimido of 4.08 grams equivalent to 0.02 mole was added, and the mixture was agitated at 0 degree in centigrade for five minutes and, thereafter, at room temperature for four hours. Cyclohexylurea was precipitated, and was filtrated. The filtrate was successively washed in 0.5M hydrochloric acid(2×10 ml) and saturated water solution of sodium bicarbonate (2×10 ml). The resultant organic layer was dehydrated with magnesium sulfate, and, thereafter, was filtrated. Using an evaporator, the solvent was removed, and was refined through a silica gel column. We obtained the objective compound of 5.67 grams. The objective monomer was viscous liquid, and the yield was 90 percent.

Elemental Analysis Report (percent by weight) C: 72.6 (72.89) H: 9.26 (9.45).

The value in parentheses was calculated value of $C_{22}H_{34}O_4$ (the molecular weight of which was 362.5082).

IR(cm$^{-1}$):2950,2874($v_{CH}$),1716($v_{c=o}$),1626($v_{c=c}$),1166 ($v_{c-o}$).

NINETEENTH EXAMPLE

Vinyl monomer expressed by the general formula (12) was synthesized as follows.

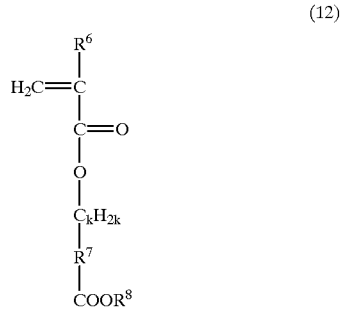

(12)

where $R^6$ was a methyl group, $R^7$ was a tetracyclo[4.4.0.1$^{2,5}$.1$^{7,10}$]dodecanediyl group, $R^8$ was a tetrahydrofuran-2-il group and k was 0.

Using 2,3-dihydrofuran instead of t-buthylalcohol, we obtained the objective monomer as similar to the eighteenth example. The objective monomer was viscous liquid, and the yield was 62 percent.

Elemental Analysis Report (percent by weight) C: 69.83 (70.19) H: 8.64 (8.57).

The value in parentheses was calculated value of $C_{22}H_{32}O_5$ (the molecular weight of which was 376.4918).

IR (cm$^{-1}$):2950,2874 ($v_{CH}$),1718 ($v_{c=o}$),1630($v_{c=c}$),1166 ($v_{c-o}$).

$^1$H-NMR (CDCl$_3$, Internal Reference Material: tetramethylsilane) ppm: 1.1–2.8(m,18H),3.5–3.8(m,2H), 3.8–4.1(m,2H),5.6–6.5(m,4H).

TWENTIETH EXAMPLE

Vinyl monomer expressed by the general formula (13) was synthesized as follows.

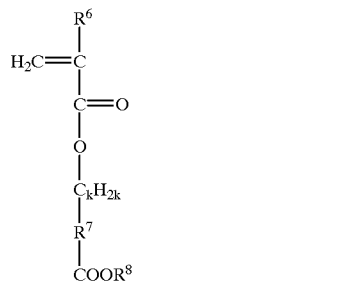

(13)

where $R^6$ was a methyl group, $R^7$ was a hexacyclo[6.6.1.1$^{3,6}$.1$^{10,13}$.0$^{2,7}$.0$^{9,14}$]heptadecanediyl group, $R^8$ was a tetrahydropyran-2-il group and k was 0.

A 200 milli-litter three-port flask with a thermometer was assembled with a drying tube of calcium chloride. Vinyl monomer of 6 grams equivalent to 0.022 mole and 3,4-dihydro-2H-pyran of 4.54 grams equivalent to 0.054 mole were mixed with methylene chloride of 80 milli-litter, and the mixture was cooled with iced water. The vinyl monomer was synthesized in the eleventh example, and was expressed by the general formula (13) where $R^6$ was a methyl group, $R^7$ was a hexacyclo[6.6.1.1$^{3,6}$.1$^{10,13}$.0$^{2,7}$.0$^{9,14}$] heptadecanediyl group, $R^8$ was a hydrogen atom and k was 0.

P-toluensulufonic acid monohydrate of 20 milli-gram was added, and the mixture was agitated for 30 minutes. Upon completion of the reaction, the reaction product was diluted in diethylether of 120 milli-litter, and was successively washed in the saturated water solution of sodium bicarbonate of 80 milli-litter, saturated water solution of salt of 80 milli-litter and water of 150 milli-litter. The resultant organic layer was dehydrated with magnesium sulfate, and, thereafter, was filtrated. Using an evaporated, the solvent and residual 3,4-dihydro-2H-pyran was removed, and we obtained the objective monomer of 6.59 grams. The objective monomer was viscous liquid, and the yield was 84 percent.

Element Analysis Report (percent by weight) C: 74.33 (73.65) H: 8.98 (8.83).

The value in parentheses was calculated value of $C_{28}H_{40}O_5$ (the molecular weight of which was 456.6210).

IR(cm$^{-1}$):2950,2870 ($v_{CH}$),1716($v_{c=o}$),1632($v_{c=c}$),1166 ($v_{c-o}$).

$^1$H NMR (CDCl$_3$, Internal Reference Material: tetramethylsilane) ppm: 1.2–2.7(m,2OH),1.95(s,3H), 3.47–3.57(m,1H),3.63–3.73(m,1H), 3.8–4.1(m,2H),5.55(s, 1H),5.94(s,1H),6.1(s,1H).

TWENTY-FIRST EXAMPLE

Vinyl monomer expressed by the general formula (14) was synthesized as follows.

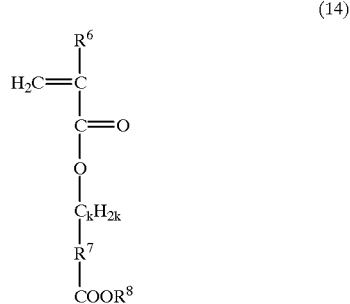

(14)

where $R^6$ was a methyl group, $R^7$ was a hexacyclo[6.6.1.1$^{3,6}$.1$^{10,13}$.0$^{2,7}$.0$^{9,14}$]heptadecanediyl group, $R^8$ was a 1-ethoxyethyl group and k was 0.

A 200 milli-litter three-port flask with a thermometer was assembled with a drying tube of calcium chloride. Vinyl monomer of 6 grams equivalent to 0.022 mole and vinylethyether of 1.30 grams equivalent to 0.022 mole were mixed with methylene chloride of 60 milli-litter, and the mixture was cooled with iced water. The vinyl monomer was synthesized in the eleventh example, and was expressed by the general formula (14) where $R^6$ was a methyl group, $R^7$ was a hexacyclo[6.6.1.1$^{3,6}$.1$^{10,13}$.0$^{2,7}$.0$^{9,14}$]heptadecanediyl group, $R^8$ was a hydrogen atom and k was 0.

P-toluensulufonic acid monohydrate of 15 milli-gram was added, and the mixture was agitated for an hour. Upon completion of the reaction, the reaction product was diluted in diethylether of 120 milli-litter, and was successively washed in the saturated water solution of sodium bicarbonate of 80 milli-litter, saturated water solution of salt of 80 milli-litter and water of 150 milli-litter. The resultant organic layer was dehydrated with magnesium sulfate, and, thereafter, was filtrated. Using an evaporator, the solvent was removed, and we obtained the objective monomer of 5.67 grams. The objective monomer was viscous liquid, and the yield was 90 percent.

Elemental Analysis Report (percent by weight) C: 71.22 (72.94) H: 8.9 (9.07).

The value in parentheses was calculated value of $C_{27}H_{40}O_5$ (the molecular weight of which was 444.6100).

IR(cm$^{-1}$):2950, 2872($v_{CH}$),1720($v_{c=o}$),1630($v_{c=c}$),1166 ($v_{c-o}$).

$^1$H-NMR (CDCl$_3$, Internal Reference Material: tetramethylsilane) ppm: 1.0–2.7(m,14H),1.2(t,3H),1.45(d, 3H),1.95(s,3H),3.75(q, 2H),3.8–4.1(m,2H),5.55(s,1H),5.9 (q,1H),6.1(s,1H).

TWENTY-SECOND EXAMPLE

Vinyl monomer expressed by the general formula (15) was synthesized as follows.

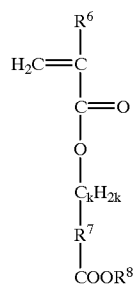

(15)

where $R^6$ was a methyl group, $R^7$ was an octacyclo[8.8.1$^{2,}$ $^9$.1$^{4,7}$.1$^{11,18}$.1$^{13,16}$.0.0$^{2,8}$.0$^{12,17}$]docosandyl group, $R^8$ was a 1-buthoxyethyl group and k was 0.

Using the vinyl monomer of the twelfth example instead of the vinyl monomer of the eleventh example, the objective monomer was synthesized as similar to the twenty-first example. The vinyl monomer of the twelfth example was expressed by the general formula (15) where $R^6$ was a methyl group, $R^7$ was an octacyclo[8.8.1$^{2,9}$.1$^{4,7}$.1$^{11,18}$.1$^{13,}$ $^{16}$.0.0$^{2,8}$.0$^{12,17}$]docosandyl group, $R^8$ was a hydrogen atom and k was 0. The objective monomer was viscous liquid, and the yield was 70 percent.

Elemental Analysis Report (percent by weight) C: 73.98 (75.80) H: 9.21 (9.35).

The value in parentheses was calculated value of $C_{34}H_{50}O_5$ (the molecular weight of which was 538.7660).

TWENTY-THIRD EXAMPLE

Vinyl monomer expressed by the general formula (16) was synthesized as follows.

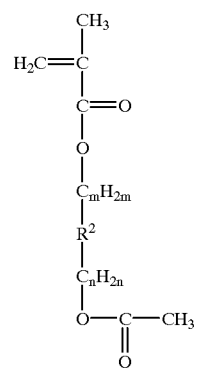

(16)

where $R^2$ was a norbornane group, m was zero and n was zero.

Norbornanediolmonomethacrylate of 5.9 grams was dissolved in pyridine of 6 milli-litter, and the solution was cooled to 0 degree in centigrade. Acetic anhydride of 3 milli-litter was added, and the reaction was continued at room temperature for 15 hours. The resultant material was poured into iced water of 100 milli-litter, and the resultant organic layer was extracted by using ether of 100 milli-litter. The resultant organic compound was successively washed in 0.5N hydrochloric acid, saturated water solution of salt, 3% water solution of sodium bicarbonate, saturated water solution of salt and water. Ether layer was dried with MgSO$_4$, and was distillated. Using a silica gel column, the resultant material was refined by using solvent of hexane and acetic ethyl regulated to 2:1, and we obtained the objective monomer of 5 grams. The objective monomer was viscous liquid.

Elemental Analysis Report (percent by weight) C: 66.0 (66.12) H: 8.53 (8.72).

The value in parentheses was calculated value of $C_{14}H_{22}O_4$ (the molecular weight of which was 254.3254).

IR(cm$^{-1}$):2880,2950($v_{CH}$),1718,1738($v_{c=o}$),1634($v_{c=c}$), 240,1164($v_{c-o}$).

TWENTY-FOURTH EXAMPLE

Vinyl monomer expressed by the general formula (17) was synthesized as follows.

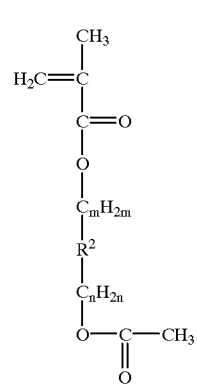

(17)

where $R_2$ was a tricyclo[5.2.1.0$^{2,6}$]decane-4,8-diyl group, m was 1 and n was 1.

Tricyclo[5.2.1.0$^{2,6}$]decane-4,8-dimethanolmonomethacrylate, which was synthesized for the second example, of 5.9 grams was dissolved in pyridine of 6 milli-litter, and the solution was cooled to 0 degree in centigrade. Acetic anhydride of 3 milli-litter was added, and the reaction was continued at room temperature for 15 hours. The resultant material was poured into iced water of 100 milli-litter, and the resultant organic layer was extracted by using ether of 100 milli-litter. The resultant organic compound was successively washed in 0.5N hydrochloric acid, saturated water solution of salt, 3% water solution of sodium bicarbonate and saturated water solution of salt. Ether layer was dried with $MgSO_4$, and was distillated. Using a silica gel column, the resultant material was refined by using solvent of hexane and acetic ethyl regulated to 2:1, and we obtained the objective monomer of 5 grams. The objective monomer was viscous liquid.

Elemental Analysis Report (percent by weight) C: 69.89 (70.77) H: 8.58 (9.38).

The value in parentheses was calculated value of $C_{19}H_{30}O_4$ (the molecular weight of which was 322.4436).

$IR(cm^{-1})$:2880,2950($v_{CH}$),1718,1738($v_{c=o}$),1634($v_{c=c}$), 1240,1164($v_{c-o}$).

TWENTY-FIFTH EXAMPLE

Vinyl monomer expressed by the general formula (18) was synthesized as follows.

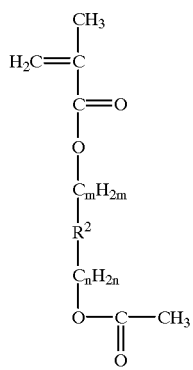

(18)

where $R_2$ was a tetracyclo[4.4.0.1$^{2,5}$.1$^{7,10}$]dodecanediyl group, m was 0 and n was 0.

Tetracylododecanediolmonomethacrylate, which was synthesized for the fifth example, of 5.9 grams was dissolved in pyridine of 6 milli-litter, and the solution was cooled to 0 degree in centigrade. Acetic anhydride of 3 milli-litter was added, and the reaction was continued at room temperature for 15 hours. The resultant material was poured into iced water of 100 milli-litter and the resultant organic layer was extracted by using of ether 100 milli-litter. The resultant organic compound was successively washed in 0.5N hydrochloric acid, saturated water solution of salt, 3% water solution of sodium bicarbonate and saturated water solution of salt. Ether layer was dried with $MgSO_4$, and was distilled. Using a silica gel column, the resultant material was refined by using solvent of hexane and acetic ethyl regulated to 2:1, and we obtained the objective monomer of 5 grams. The objective monomer was viscous liquid.

Elemental Analysis Report (percent by weight) C: 70.65 (71.39) H: 9.23 (9.59).

The value in parentheses was calculated value of $C_{20}H_{32}O_4$ (the molecular weight of which was 366.4704).

$IR(cm^{-1})$:2880,2950($v_{CH}$),1718,1738($v_{c=o}$),1634($v_{c=c}$), 1240,1164($v_0$).

TWENTY-SIXTH EXAMPLE

Vinyl monomer expressed by the general formula (19) was synthesized as follows.

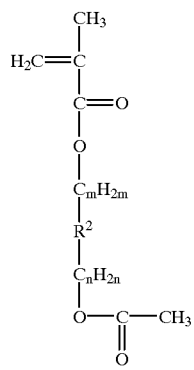

(19)

where $R_2$ was a hexacycloheptadecan group, m was 0 and n was 0.

Hexacycloheptadecanediolmonomethacrylate, which was synthesized for the sixth example, of 5.9 grams was dissolved in pyridine of 6 milli-litter, and the solution was cooled to 0 degree in centigrade. Acetic anhydride of 3 milli-litter was added, and the reaction was continued at room temperature for 15 hours. The resultant material was poured into iced water of 100 milli-litter, and the resultant organic layer was extracted by using ether of 100 milli-litter. The resultant organic compound was successively washed in 0.5N hydrochloric acid, saturated water solution of salt, 3% water solution of sodium bicarbonate and saturated water solution of salt. Ether layer was dried with $MgSO_4$, and was distillated. Using a silica gel column, the resultant material was refined by using solvent of hexane and acetic ethyl regulated to 2:1, and we obtained the objective monomer of 5 grams. The objective monomer was viscous liquid.

Elemental Analysis Report (percent by weight) C: 73.21 (74.58) H: 8.98 (8.87).

The value in parentheses was calculated value of $C_{24}H_{34}O_4$ (the molecular weight of which was 386.5302).

$IR(cm^{-1})$:2880,2950($v_{CH}$),1718,1738($v_{c=o}$),1634($v_{c=c}$), 1240,1164($v_{c-o}$).

TWENTY-SEVENTH EXAMPLE

Vinyl monomer expressed by the general formula (20) was synthesized as follows.

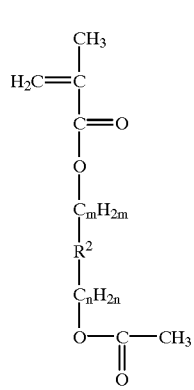

(20)

where $R^2$ was an octacyclodococane group, m was 0 and n was 0.

Octacyclodococandiolmonomethacrylate, which was synthesized for the seventh example, of 5.9 grams was dissolved in pyridine of 6 milli-litter, and the solution was cooled to 0 degree in centigrade. Acetic anhydride of 3 milli-litter was added, and the reaction was continued at room temperature for 15 hours. The resultant material was poured into iced water of 100 milli-litter, and organic layer was extracted by using ether of 100 milli-litter. The resultant organic compound was successively washed in 0.5N hydrochloric acid, saturated water solution of salt, 3% water solution of sodium bicarbonate and saturated water solution of salt. Ether layer was dried with $MgSO_4$, and was distillated. Using a silica gel column, the resultant material was refined by using solvent of hexane and acetic ethyl regulated to 2:1, and we obtained the objective monomer of 5 grams. The objective monomer was viscous liquid.

Elemental Analysis Report (percent by weight) C: 75.21 (76.95) H: 8.98 (8.91).

The value in parentheses was calculated value of $C_{29}H_{40}O_4$ (the molecular weight of which was 452.6326).

IR($cm^{-1}$):2880,2950($v_{CH}$),1718,1738($v_{c=o}$),1634($v_{c=c}$), 1240,1164($v_{c-o}$).

TWENTY-EIGHT EXAMPLE

Tricyclodecandiolmonomethacrylate was synthesized as follows.

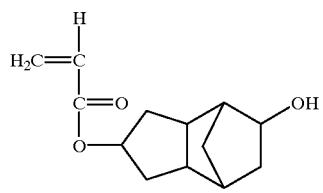

The synthesis was similar to the fourth example. However, methacryloyl chloride of 10.4 grams equivalent to 100 mmol was substituted by acryloyl chloride of 9.1 grams equivalent to 100 mmol. We obtained tricyclodecandiolmonomethacrylate of 5.2 grams. The yield was 21 percent.

$^1$H-NMR($CDCl_3$, Internal standard tetramethylsilan) :0.95–2.5(m,13H),3.0–3.2(s,1H)4.0–4.05(m,1H),4.6–4.8(m, 0.7H),5.2–5.3(m,0.3H),5.75–5.8(m,1H),6.0–6.1(m,1H), 6.3–6.45(m,1H).

Elemental Analysis Report (percent by weight) C: 71.0 (70.6) H: 9.10 (9.3).

The values in parentheses were indicative of the calculated values of $C_{14}H_{22}O_3$, the molecular weight of which was 238.16.

1R($cm^{-1}$)3350(vOH), 1725(vc=0), 1630 (vc=c).

TWENTY-NINTH EXAMPLE

Tetracyclododecandiolmonoacrylate was synthesized as follows.

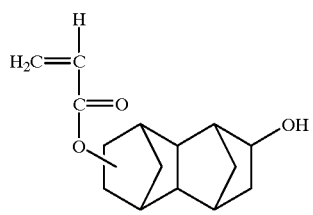

The synthesis was similar to the fifth example. Nevertheless, methacryloyl chloride of 10.4 grams (100 mmol) was substituted by acryloyl chloride of 9.1 grams equivalent to 100 mmol. We obtained tetracyclododecandiolmonoacrylate of 5.0 grams, and the yield was 20 percent.

$^1$H NMR($CDCl_3$, Internal standard tetramethylsilan) :0.65–2.6(m,14H),4.04–4.24(m,1H),4.99(m,1H),5.75–5.8 (m,1H),6.0–6.1(m,$_1$H),6.3–6.45(m,1H),6.0–6.1(m,1H), 6.3–6.45(m,1H).

Elemental Analysis Report (percent by weight) C: 72.7 (72.69) H: 8.89 (9.15).

The values in parentheses were indicative of the calculated values of $C_{16}H_{24}O_3$, the molecular weight of which was 264.17.

1R($cm^{-1}$)3420(vOH),1715(vc=0),1634 (vc=c), 1165(vc-0).

THIRTIETH EXAMPLE

Carboxytricyclodecanylmethylacrylate was synthesized as follows.

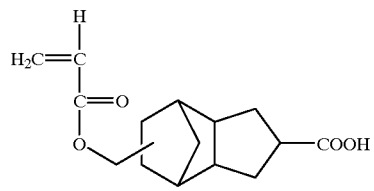

The synthesis was similar to that of the ninth example. Methacryloyl chloride of 10.4 grams (100 mmol) was substituted by acryloyl chloride of 9.1 grams equivalent to 100 mmol. We obtained carboxytricyclodecanylmethylacrylate of 5.0 grams, and the yield was 20 percent.

$^1$H-NMR($CDCl_3$, Internal standard tetramethylsilan) :0.8–2.7(m,14H),3.88–4.17(m,14H),3.88–4.17(m,2H), 5.75–5.8(m,1H),6.0–6.1(m,1H),6.3–6.45(m,1H).

Elemental Analysis Report (percent by weight) C: 70.33 (68.55) H: 8.52 (8.63).

The values in parentheses were indicative of the calculated values of $C_{16}H_{24}O_4$, the molecular weight of which was 280.167.

1R($cm^{-1}$)3355(vOH),1725(vc=0), 1635(vc=c).

THIRTY-FIRST EXAMPLE

Carboxytetracyclododesenacrylate was synthesized as follows.

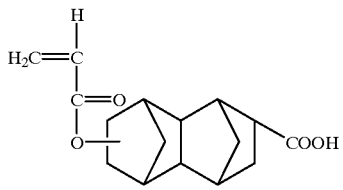

The synthesis was similar to that of the tenth example. Methacryloyl chloride of 10.4 grams(l00 mmol) was substituted by acryloyl chloride of 9.1 grams equivalent to 100 mmol. We obtained carboxytetracyclododesenacrylate of 5.0 grams, and the yield was 20 percent.

$^1$H-NMR($CDCl_3$, Internal standard tetramethylsilan): ™1.1–1.95(10H,m),2.1–2.85(5H,m),5.0(1H,s),5.79(1H,d), 6.07(1H,dd),6.36(1H,d),10.5–12(1H,br).

Elemental Analysis Report (percent by weight) C: 70.81 (69.84) H: 7.92 (8.27).

The values in parentheses were indicative of the calculated values of $C_{17}H_{24}O_4$, the molecular weight of which was 292.167.

1R(cm$^{-1}$):2800–3450(vOH),2950(vCH),1700, 1714(v$_{c=0}$), 1618, 1632(v$_{c=c}$), 1200(v0–0).

THIRTY-SECOND EXAMPLE

Vinyl monomer expressed by the following general formula was synthesized as follows. In the following general formula, $R^6$ was hydrogen, $R^7$ was tricyclo[5.2.1.0$^{2,6}$]decane-4,8-diyl group, $R^8$ was tetrahydropyran-2-il group, and k was 1.

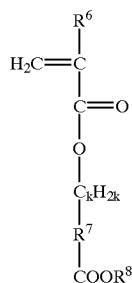

A 200-milli-litter three-port flask was assembled with a drying tube of calcium chloride and a thermometer, and the vinyl monomer described as the thirtieth example (in which $R^6$ was a hydrogen, $R^7$ was tricyclo[5.2.1.0$^{2,6}$]decane- 4,8-dil group, $R^8$ was a hydrogen and k is 1) of 6 grams (equivalent to 0.022 mol), 3,4-dihydro-2H-pyran of 4.45 grams (equivalent to 0.054 mol) and methylane chloride of 80 ml were mixed in the flask, and the mixture was cooled in ice. Monohydrate of p-toluensulfonic acid of 20 mg was added thereto, and was agitated for 30 minutes. After completion of the reaction, the reaction compound was diluted in diethl ether of 120 ml, and, thereafter, washed in saturated water solution of sodium hydrogencarbonate of 80 ml in saturated water solution of salt of 80 ml and in water of 150 ml in this order. The resultant organic layer was dehydrated by using magnesium sulfate, and was, thereafter, filtrated. The solvent and residual 3,4-dihydro-2H-pyran were removed by using an evaporator. We obtain the objective compound of 6.59 grams. The objective compound was viscous liquid, and the yield was 84 percent.

Elemental Analysis Report (percent by weight) C: 69.5 (69.2) H: 8.64 (8.85).

The values in parentheses were indicative of the calculated values of $C_{21}H_{32}O_5$, the molecular weight of which was 364.23.

1R(cm$^{-1}$):2950,2870(vCH), 1716,(vc=0), 1632(vc=c), 1166(vc–0).

$^1$H-NMR(CDCl$_3$, Internal standard tetramethylsilan) ppm:1.2–2.7(m,20H), 3.47–3.57(m,1H),3.63–3.73(m,1H), 3.8–4.1(m,2H),5.79(m,1H),5.9–6.0(s,1H),6.05(m,1H),6.36 (m,1H).

THIRTY-THIRD EXAMPLE

Vinyl monomer expressed by the following general formula was synthesized as follows. In the following general formula, $R^6$ was a hydrogen, $R^7$ was tricyclo[5.2.1.0$^{2,6}$] decane-4,8-diyl group, $R^8$ was 1-ethoxy ethyl group, and k was 1.

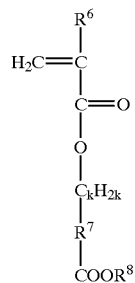

A 200-milli-litter three-port flask was assembled with a drying tube of calcium chloride and a thermometer, and the vinyl monomer described as the thirtieth example (in which $R^6$ was a hydrogen $R^7$ was tricyclo[5.2.1.0$^{2,6}$]decane-4.8-dil group, $R^8$ was a hydrogen and k is 1) of 6 grams (equivalent to 0.022 mol), vinylethylether of 1.30 grams (equivalent to 0.022 mol) and methylane chloride of 60 ml were mixed in the flask, and the mixture was cooled in ice. Monohydrate of p-toluensulfonic acid of 15 mg was added thereto, and was agitated for an hour. After completion of the reaction, the reaction compound was diluted in diethl ether of 120 ml, and, thereafter, washed in saturated water solution of sodium hydrogencarbonate of 80 ml, in saturated water solution of salt of 80 ml and in water of 150 ml in this order. The resultant organic layer was dehydrated by using magnesium sulfate, and was, thereafter, filtrated. The solvent was removed by using an evaporator. We obtain the objective compound of 5.67 grams. The objective compound was viscous liquid, and the yield was 90 percent.

Elemental Analysis Report (percent by weight) C: 69.9 (68.15) H: 9.02 (9.15).

The values in parentheses were indicative of the calculated values of $C_{20}H_{32}O_5$, the molecular weight of which was 352.225.

1R(cm$^{-1}$):2950,2872(vCH), 1720(vc=0), 1630 (vc=c), 1166(vc–0).

$^1$H-NMR(CDCl$_3$, Internal standard=tetramethylsilan) ppm:1.0–2.7(m,14H),1.45(d,3H),1.95(s,3H),3.75(q,2H), 3.8–4.1(m,2H),5.75(m,1H),5.9(s,1H),6.05(m,1H),6.36(m, 1H).

THIRTY-FOURTH EXAMPLE

Vinyl monomer expressed by the following general formula was synthesized as follows. In the following general formula, $R^6$ was a hydrogen, $R^7$ was tetracyclo[4.4.0.1$^{2,5}$.1$^{7,10}$]dodecanediyl group, $R^8$ was tert-buthyl group, and k was 0.

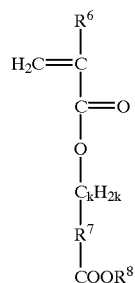

A 100-millilitter round flask was assembled with a drying tube of calcium chloride, and the vinyl monomer described as the thirty-first example of 5 grams (equivalent to 0.018 mol), t-butylalcohol of 3.99 grams (equivalent to 0.054 mol), methylane chloride of 30 ml and 4-dimethylamonopyridine of 1.76 grams (equivalent to 0.014 mol) were mixed in the flask, and the mixture was cooled to zero degrees in centigrade. Dicyclohexylcarbodimide of 4.08 grams (equivalent to 0.020 mol) was added thereto, and was agitated at zero degrees in centigrade for five minutes. Thereafter, the agitation was continued for 4 hours at room temperature. Cyclohexyl urea was segragated, and was filtrated. The filtrate was washed in 5M hydrochloric acid (2×10 ml) and thereafter, in saturated water solution of sodium hydrogencarbonate (2×10 ml) in this order. The resultant organic layer was dehydrated by using magnesium sulfate, and was, thereafter, filtrated. The solvent was removed by using an evaporator, and the resultant compound was refined by using a column of silica gel. We obtain the objective compound of 5.67 grams. The objective compound was viscous liquid, and the yield was 90 percent.

Elemental Analysis Report (percent by weight) C: 72.6 (72.38) H: 9.03 (9.15).

The values in parentheses were indicative of the calculated values of $C_{21}H_{32}O_4$, the molecular weight of which was 348.23.

$1R(cm^{-1}):3460(vOH),2950(vCH),1720(vC=0),1634(vC=C), 1166(vc-0)$.

THIRTY-FIFTH EXAMPLE

Vinyl monomer expressed by the following general formula was synthesized as follows. In the following general formula, $R^6$ was a hydrogen, $R^7$ was tetracyclo[$4.4.0.1^{2,5}.1^{7,10}$]dodecanediyl group, $R^8$ was tetrahydrofuran-2-il group, and k was 0.

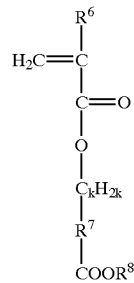

The synthesis was similar to the thirty-four example. However, t-buthylalcohol was substituted by 2,3-dihydrofuran. We obtained the objective compound in the form of viscous liquid, and the yield was 62 percent.

Elemental Analysis Report (percent by weight) C: 69.98 (69.59) H: 8.28 (8.34).

The values in parentheses were indicative of the calculated values of $C_{21}H_{30}O_5$, the molecular weight of which was 362.209.

$1R(cm^{-1}):2950,2874(vCH),1718(vC=0),1630(vC=C), 1166(vc-0-C)$.

$^1H$-NMR($CDCl_3$, Internal standard=tetramethylsilan) ppm:1.1–2.8(m,21H),3.5–3.8(m,1H),3.8–4.1(m,2H),5.7(m,1H),5.95(s,1H),6.05(m,1H),6.36(m,1H).

Copolymers

FIRST EXAMPLE

Using the vinyl monomer of the thirteenth example, the vinyl monomer of the ninth example and the vinyl monomer of the third example, copolymer was synthesized as follows.

We prepared a 100 milli-litter eggplant type flask, and three cocks and a condenser tube were attached to the flask. The vinyl monomer of the thirteenth example, the vinyl monomer of the ninth example and the vinyl monomer of the third example were regulated to 0.4:0.4:0.2 in mole, and were dissolved in dry tetrahydrofuran of 50 milli-litter. Azobisisobuthylonitryl serving as polymerization initiator was added to the solution by 0.164 gram equivalent to 1.0 milli-mole, and was heated to 60 degrees in centigrade for 3 hours in argon gas ambience. The reaction system was cooled to room temperature, and the reaction product was poured into ether of 0.5 litter. Precipitation was gathered, and a refining was repeated in tetrahydrofuran and ether, again. Copolymer was precipitated, and was filtrated. The copolymer was dried in vacuum at 40 degrees in centigrade for 24 hours. We obtained the objective copolymer of 3.5 grams in the form of white powder, and the yield was 70 percent. The copolymer was analyzed by using an analyzer model LC-9A/SPD-6A manufactured by Shimazu Manufacturing Corporation, and an analyzing column was GPCKF-80M manufactured by Showa Denko. Solvent of tetrahydrofuran was used in the analyzing column. The weight average molecular weight was equivalent to 9000 in polystyrene.

Analyzing Report $1R(cm^{-1}):3350(v_{OH}),1720(v_{c=0})$.

$v_{c=0}$ was representative of disappearance of absorption band corresponding to carbonyl group.

SECOND EXAMPLE TO NINTH EXAMPLE

Similar to the above-described first example, copolymers were synthesized as shown in table 2. In table 2, the ratio of monomers was expressed by mole.

TABLE 2

| Example | Monomers | Ratio of Monomers | x/y/z | Molecular Weight |
|---|---|---|---|---|
| 2 | Examples 32 and 4 | 0.5/0/0.5 | 0.45/0/0.55 | 26000 |
| 3 | Examples 34 and 5 | 0.4/0/0.6 | 0.41/0/0.55 | 32700 |
| 4 | Examples 35, 10 and 5 | 0.5/0.3/0.2 | 0.5/0.3/0.2 | 27600 |
| 5 | Examples 20, 11, 6 | 0.3/0.4/0.3 | 0.29/0.39/0.32 | 43100 |
| 6 | Examples 22, 12 and 7 | 0.5/0.3/0.2 | 0.5/0.31/0.19 | 29000 |
| 7 | Examples 34, 10 and 25 | 0.4/0.2/0.4 | 0.39/0.18/0.43 | 28750 |
| 8 | Examples 21 and 26 | 0.5/0/0.5 | 0.51/0/0.49 | 33000 |
| 9 | Examples 22, 12 and 27 | 0.3/0.4/0.3 | 0.25/0.41/0.33 | 36200 |
| 10 | Examples 28, 30 and 32 | 0.6/0.3/0.1 | 0.6/0.25/0.15 | 27000 |
| 11 | Examples 29, 31 and 34 | 0.7/0.2/0.1 | 0.6/0.2/0.2 | 26000 |
| 12 | Examples 29 and 31 | 0.7/0.3/0 | 0.72/0.28/0 | 20000 |
| 13 | Examples 28 and 31 | 0.68/0.32/0 | 0.7/0.3/0 | 23000 |

The present inventors evaluated the first example to the thirteenth example of copolymer as follows. Each of the first to the thirteenth examples of 2 grams was dissolved in diethyleneglycol of 10 grams, and the solution was filtrated with a teflon filter element. The teflon filter element had an average diameter of 0.2 micron. The filtrate was spun onto a 3-inch silicon substrate, and was baked on a hot plate (not shown) at 90 degrees in centigrade for 60 seconds. The filtrate formed a thin film of 0.7 micron thick.

The present invention formed the first comparative example of poly(p-vinylphenol) and a second comparative example of polymethylmetacrylate. The poly(p-vinylphenol) was popular to KrF excimer laser lithography, and served as base polymer of the resist used therein. On the other hand, polymethylmetacrylate of the second comparative example did not have the cyclic hydrocarbon in its molecular structure.

Using a reactive ion etching system manufactured by Nichiden-Anerba as Model DEM451, the present inventor measured the etching velocity of each thin film. Etching gas was $CF_4$ at 30 sccm under 5 Pa. Power was regulated to 100 watts.

TABLE 3

| Specimen | Copolymer | Etching Velocity (A/min) |
| --- | --- | --- |
| 1 | Example 1 | 167 |
| 2 | Example 2 | 163 |
| 3 | Example 3 | 160 |
| 4 | Example 4 | 159 |
| 5 | Example 5 | 105 |
| 6 | Example 6 | 103 |
| 7 | Example 7 | 161 |
| 8 | Example 8 | 107 |
| 9 | Example 9 | 102 |
| 10 | Example 10 | 164 |
| 11 | Example 11 | 163 |
| 12 | Example 12 | 162 |
| 13 | Example 13 | 165 |
| Comparative sample 1 | poly(p-vinylphenol) | 167 |
| Comparative sample 2 | poly(methylmethacrylate) | 262 |

As will be understood from Table 3, the copolymers of the present invention were smaller in etching velocity than the polymethylmetacrylate. When comparing the copolymers with polyvinylphenol, the etching velocity of the copolymers was not larger than that of the polyvinylphenol. Thus, the copolymers according to the present invention well withstood the etchant.

Chemically Amplified Resists

Using the copolymers described hereinbefore, the present inventors produced the following embodiments.

First Embodiment

The first embodiment was produced from the following materials.

1-1. Polymer: example 1 . . . 0.950 gram 1-2. Photoacid generator: cyclohexylmethyl(2-oxisocyclohexyl)sulfonium trifluoromethanesulfonato, which was expressed by the general formula (4) . . . 0.050 gram 1-3. Solvent: Propylaneglycolmonomethyletheracetate . . . 4.000 grams The polymer and the photoacid generator were dissolved in the solvent, and the solution was filtrated by using a teflon filter of 0.2 micron. Then, we obtained the first embodiment of the chemically amplified resist embodying the present invention.

The present inventor investigated the transparency and the resolution of the chemically amplified resist implementing the first embodiment as follows.

The chemically amplified resist implementing the first embodiment was spun onto a 3-inch silicon wafer, and was baked on a hot plate (not shown) at 80 degrees in centigrade for 60 seconds. The chemically amplified resist film was 0.7 micron thick. The dependence on the wavelength of exposure light was measured by using an ultra-violet-visual light spectrophotometric detector. The transparency to 193.4 nanometer wavelength light was 71 percent. Thus, the chemically amplified resist implementing the first embodiment achieved good transparency.

Subsequently, the present inventor placed the chemically amplified resist film in ArF reduction projection aligner, and the chemically amplified resist film was exposed to the light so as to form a latent image of a line-and-space pattern. The numerical aperture was 0.55, and σ was 0.7. After the exposure to the light, the chemically amplified resist film was baked on the hot plate at 90 degrees in centigrade for 60 seconds.

After the post-baking, the chemically amplified resist film was dipped in alkaline developing solution for 60 seconds at 23 degrees in centigrade, and the latent image was developed. The alkaline developing solution contained tetramethyl-ammonium-hydroxide at 2.3 part by weight. The chemically amplified resist film was rinsed in pure water for 60 seconds, and exposed parts of the chemically amplified resist were removed. 0.20-micron line-and-space pattern was formed at 15 $mJ/cm^2$. Using the scanning electron microscope manufactured by Hitachi Manufacturing Corporation as Model SE-4100, the present inventor observed the line-and-space pattern, and confirmed that the line-and-space pattern was without residue of the resist and peeling from the wafer.

Second Embodiment to Eleventh Embodiment

Similar to the first embodiment, the present inventor produced the second embodiment to the eleventh embodiment of the chemically amplified resist according to the present invention. Polymer was changed from the first example to the second-eleventh examples. The present inventor measured the sensitivity and the resolution, and summarized in Table 5.

TABLE 5

| Embodiment | Polymer | Sensitivity ($mJ/cm^2$) | Resolution |
| --- | --- | --- | --- |
| 2 | Second example | 37 | 0.20 |
| 3 | Third example | 45 | 0.20 |
| 4 | Fourth example | 8 | 0.19 |
| 5 | Fifth example | 15 | 0.18 |
| 6 | Sixth example | 17 | 0.20 |
| 7 | Seventh example | 23 | 0.25 |
| 8 | Eighth example | 16 | 0.19 |
| 9 | Ninth example | 33 | 0.22 |
| 10 | Tenth example | 12 | 0.20 |
| 11 | Eleventh example | 35 | 0.20 |

As will be appreciated from the foregoing description, the new monomers are polymerized so as to provide the copolymer appropriate for the chemically amplified resist. The copolymer exhibits good transparency and good sensitivity to the far ultra-violet light, and achieves good resolution. Thus, the chemically amplified resist is appropriate for the lithography using the far ultra violet light equal to or less than 248 nanometer wavelength. Especially, ArF excimer laser light can form a miniature latent image in the chemically amplified resist according to the present invention.

Twelfth Embodiment

The twelfth embodiment was produced from the following materials.

1-1. Polymer example 12 . . . 0.87 gram 1-2. Photoacid generator: cyclohexylmethyl(2-oxisocyclohexyl)sulfonium trifluoromethanesulfonato, which was expressed by the general formula (4) . . . 0.03 gram 1-3. Cross-linking agent: hexamethoxymethylolmelamine 0.1 gram 1-4. Solvent: cyclohexanone . . . 5.67 grams The polymer, the photoacid generator and the cross-linking agent were dissolved into the solvent, and the solution was filtrated by using a teflon filter of 0.2 micron diameter. The chemically amplified negative resist thus obtained was spun onto a 3-inch silicon wafer, and was baked on a hot plate at 120 degress in centigrade for 60 seconds (not shown). The chemically amplified negative resist film was 0.5 micron thick.

Subsequently, the present inventor placed the chemically amplified negative resist film in ArF reduction projection aligner, and the chemically amplified resist film was exposed to the light so as to form a latent image of 0.30 micron line-and-space pattern. The numerical aperture was 0.55, and a was 0.7. After the post-baking, the latent image was developed, and the chemically amplified negative resist layer was formed into a negative resist pattern. A negative 0.30-micron line-and-space pattern was formed at 6mJ/cm$^2$. Using the scanning electron microscope, the present inventor observed the line-and-space pattern, and confirmed that the line-and-space pattern was without residue of the resist and peeling from the wafer.

Thirteenth Embodiment

Using the thirteenth example of the polymer, the chemically amplified negative resist implementing the thirteenth embodiment was produced as similar to the twelfth embodiment. The chemically amplified negative resist was spun onto a silicon wafer, and was baked at 115 degrees in centigrade for 60 seconds. Then, the silicon wafer was laminated with a chemically amplified negative resist layer of 0.5 micron thick. Using the ArF reduction projection aligner, 0.2 micron line-and-space pattern was transferred to the chemically amplified negative resist layer, and the latent image was developed. The 0.2 micron line-and-space pattern was obtained at 9.5 mJ/cm$^2$, and the present inventor observed through the scanning electron microscope. The present inventors confirmed that the line-and-space pattern was without residue of the resist and peeling from the wafer.

Subsequently, the present inventors formed chemically amplified resist layers on silicon wafers from the second embodiment to the thirteenth embodiment, respectively.

A third comparative example was formed by using Novolak resist for i-ray manufactured by Sumitomo Chemical Industry Corporation, and the Novolak resist was assigned product code "PF1-15A", and a fourth comparative example was formed by using carboxytetracyclododecen-methacrylate. The tenth example of monomer was dissolved in dry tetrahydrofran, and azobisisobuthylonytril was added to the solution. The monomer was heated in argon ambience, and was polymerized into carboxytetracyclododecen-methacrylate.

The contact angle was measured for the above embodiments and the comparative examples with respect to pure water and methylaneiodide. The contact angle meter was uses for the measurement, and was manufactured by Kyowa Kaimen Kagaku Corporation, and the model code was CA-X. Using the contact angle, adhesion work was estimated by using Young equation, which was taught by H. Yanazawa et. al. in Colloids and Surfaces, volume 9, pages 133–145, 1984. The adhesion work was summarized in Table 6.

TABLE 6

| Embodiment | Component polymer | Adhesion work (mN · cm$^{-2}$) |
| --- | --- | --- |
| 11 | Example 2 | 84.6 |
| 12 | Example 3 | 84.4 |
| 13 | Example 4 | 85.5 |
| 14 | Example 5 | 85.7 |
| 15 | Example 6 | 84.9 |
| 16 | Example 7 | 84.9 |
| 17 | Example 8 | 85.1 |
| 18 | Example 9 | 84.7 |
| 19 | Example 10 | 86.0 |
| 20 | Example 11 | 84.3 |
| 21 | Example 12 | 85.7 |
| 22 | Example 13 | 86.2 |
| Comparative Example-3 | PF1-15A | 80.3 |
| Comparative Example-4 | Poly(carboxytetra-Cyclododecenmethacrylate | 84.3 |

As will be understood from Table 6, the chemically amplified resist according to the present invention was strongly adhered to the silicon wafer. In fact, the adhesion of the chemically amplified resist according to the present invention was larger than that of the resist for i-ray lithography. If zero was substituted for "y" and "z" of the general formula (2), the resin was called as poly(carboxytetracyclododecenmethacrylate), and the chemically amplified resist achieved the strong adhesion rather than it. Thus, the monomer suffixed with "x" in general formula (1) drastically increased the adhesion of the resist to the substrate.

Finally, the present inventor investigated the solubility of the chemically amplified resist according to the present invention. If each of $R^2$ and $R^3$ was a hydrogen atom, m is zero and n is zero, $R^2$ was a tricyclodecandiyl group, $R^4$ was a hydrogen atom,i is zero, $R^5$ was a tetracyclododecandiyl group and "z" was zero, the compound varied the solubility in alkaline developing solution together with value "x". Using 2.38 percent water solution of tetramethylammoniumhydroxyde as the alkaline developing solution, the present inventors measured the solubility. The solubility was plotted in FIG. 1. When "x" was varied from zero to 0.75, the solubility was within the range between 0.7 micron/second to 4 micron/second as indicated by plots PL1. The solubility was large enough to use it in commercial process. However, if "x" was increased to 0.8, the solubility was decreased to 3×10$^{-5}$ micron/second. Thus, the chemically amplified resist according to the present invention had a threshold for "x". In this instance, the threshold was 0.75. This phenomenon was derived from the polarity converting group, i.e., $R^8$ in the general formula (2) and the cross linking agent. The polarity converting group and/or the cross linking agent were causative of variation of solubility, and the variation of solubility made the dissolving speed of the chemically amplified resist according to the present invention drastic. Using this property, it was possible to produce an extremely high sensitive resist.

Pattern Transfer Process

Figure 2:
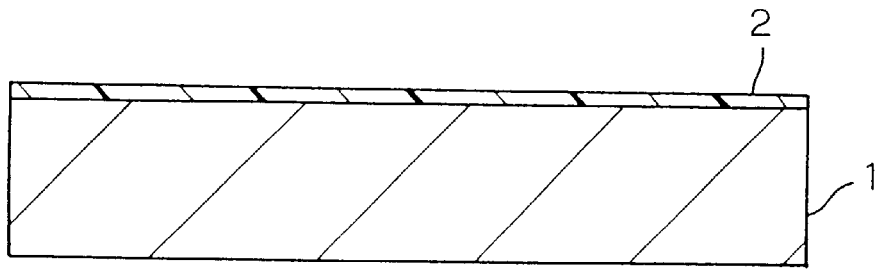
FIGS. 2 to 7 are cross sectional views showing a process of forming a resist mask according to the present invention.

Using the chemically amplified resist according to the present invention, a pattern is transferred to a chemically amplified resist mask as follows. First, the chemically amplified resist is spun onto a solid structure such as a semiconductor wafer 1, and forms a liquid layer 2 of chemically amplified resist as shown in FIG. 2.

Figure 3:
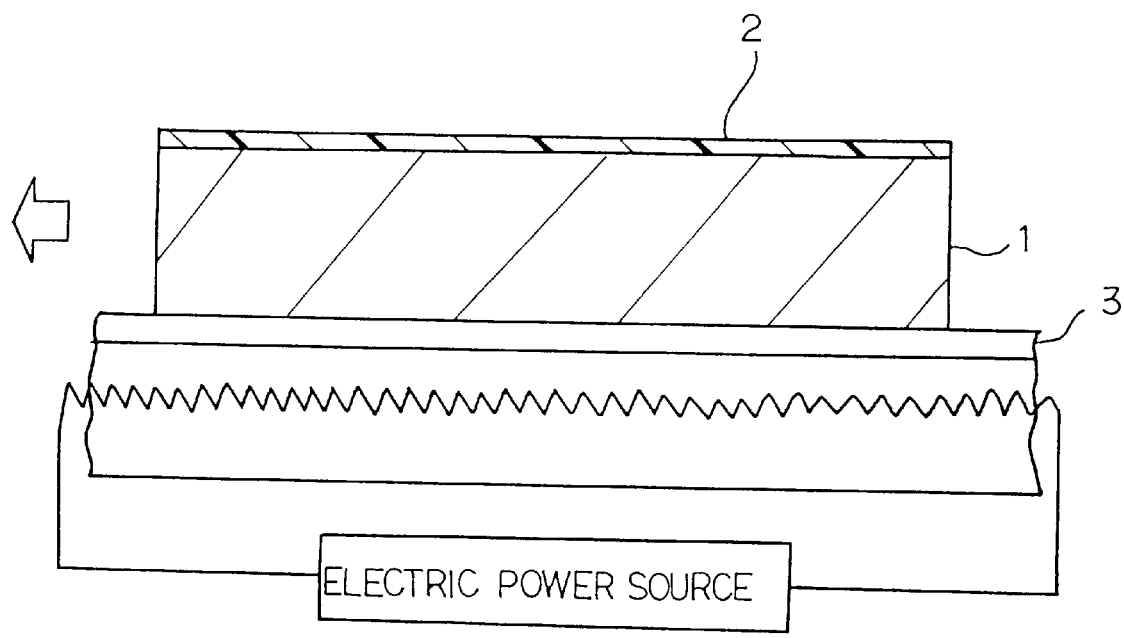

The semiconductor wafer 1 is placed on a hot plate 3, and the layer of chemically amplified resist is baked as shown in FIG. 3. Then, the solvent is vaporized, and the semiconductor wafer 1 is covered with a chemically amplified resist layer 4.

Figure 4:
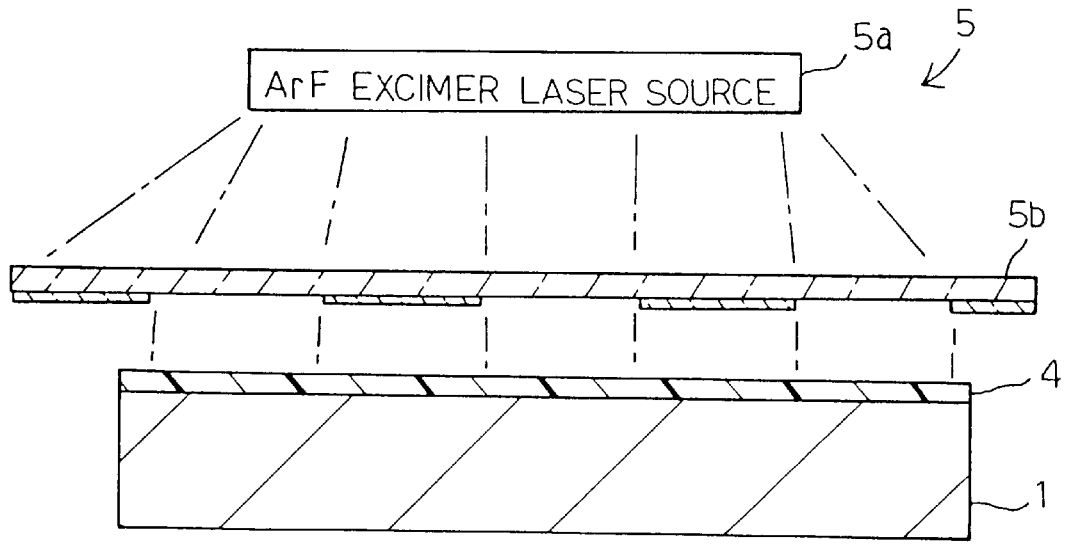

The semiconductor wafer 1 is placed in an aligner 5, and ArF excimer laser light is radiated form a laser light source 5a. The excimer laser light passes a reticle 5b, and an image carrying light is incident onto the chemically amplified resist layer 4 as shown in FIG. 4. Then, a patent image was formed in the chemically amplified resist layer 4.

Figure 5:
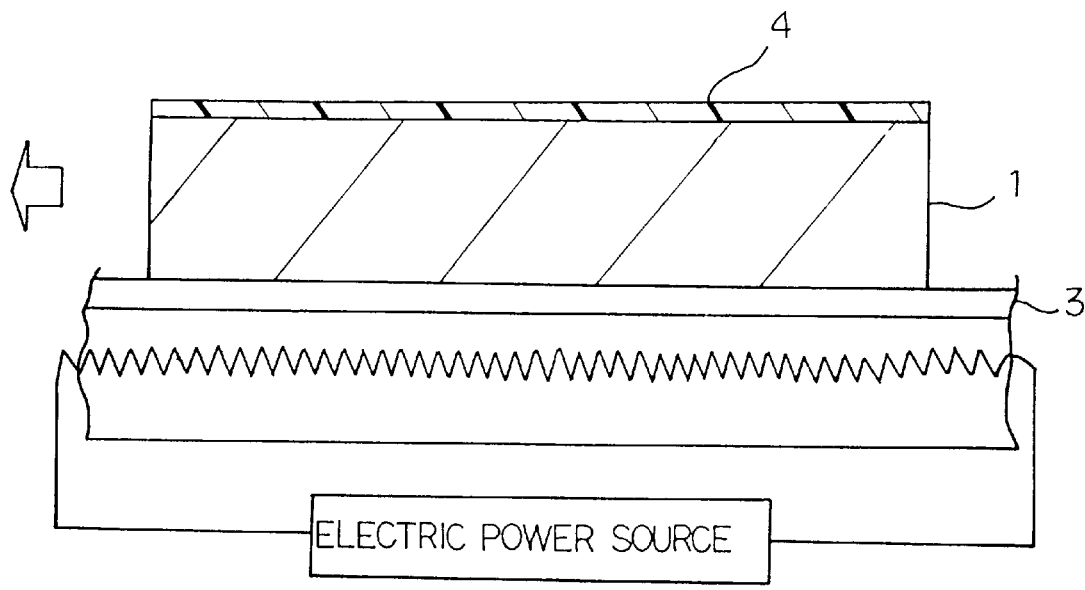

The chemically amplified resist layer 4 is subjected to a post-baking as shown in FIG. 5. In this instance, the hot plate is used for the post-baking. However, another heater such as an infrared over is available for the post baking.

Figure 6:
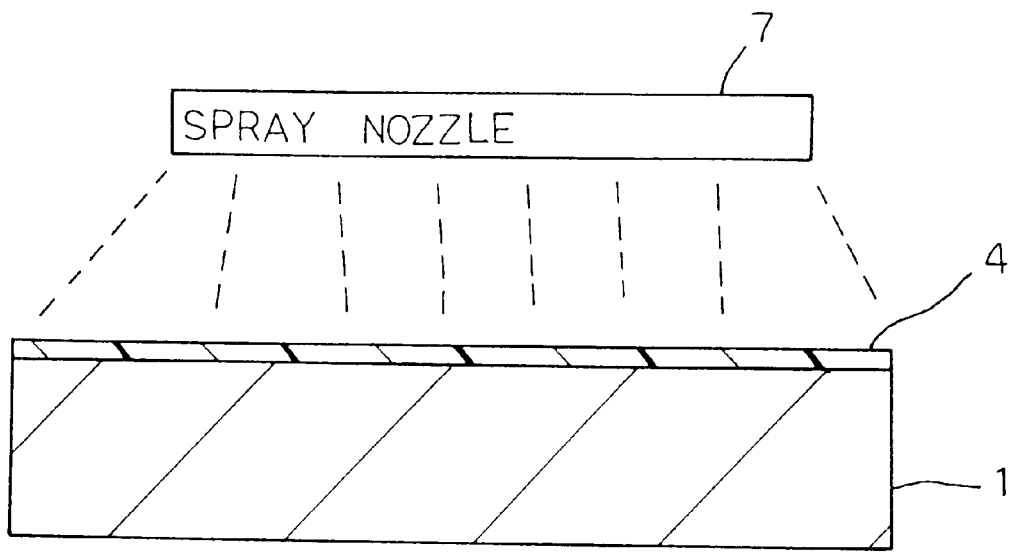
Figure 7:
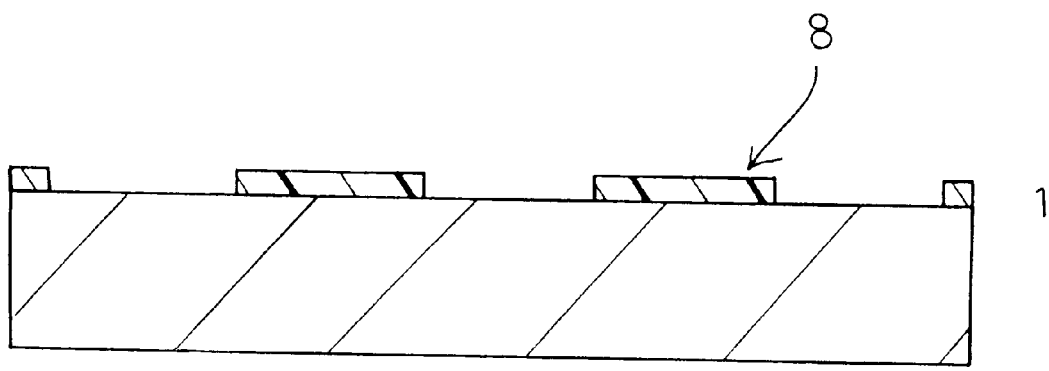

The latent image is developed with alkaline developing solution. In this instance, the semiconductor wafer 1 is conveyed under a spray nozzle 7, and the alkaline solution is sprayed on the chemically amplified resist layer 4 as shown in FIG. 6. However, another developing apparatus is available. The alkaline developing solution partially dissolves the chemically amplified resist layer, and a mask layer 8 is left on the semiconductor wafer 1 as shown in FIG. 7.

Although particular embodiments of the present invention have been shown and described, it will be obvious to those skilled in the art that various changes and modifications may be made without departing from the spirit and scope of the present invention.

What is claimed is:

1. A chemically amplified resist comprising
   a photoacid generator contained at 0.2 part to 25 parts by weight,
   a cross linking agent activated in the presence of acid and contained at 1 part to 40 parts, and
   a polymer contained at 50 parts to 98.8 parts by weight and copolymerized between compound and monomer expressed by the general formula:

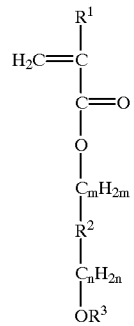

wherein $R^1$ represents a hydrogen atom or a methyl group, $R^2$ represents a bridged hydrocarbon group having the carbon number between 7 and 22, m equals 0 or 1, n equals 0 or 1 and $R^3$ represents a hydrogen atom, a methyl group or an acetyl group.

2. The chemically amplified resist as set forth in claim 1, in which said polymer has a weight average molecular weight ranging between 1,000 and 50,000, and is expressed by the general formula:

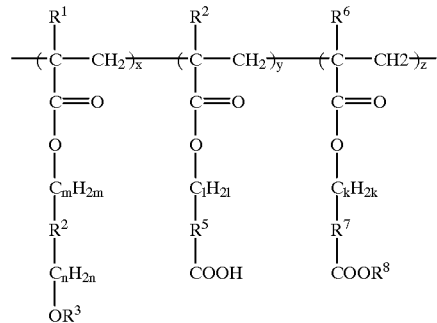

wherein $R^1$, $R^4$ and $R^6$ represent a hydrogen atom or a methyl group, $R^2$, $R^5$ and $R^7$ represent a bridged hydrocarbon group having the carbon number from 7 to 22, $R^3$ represents a hydrogen atom, a methyl group or an acetyl group, $R^8$ represents a group decomposed by acid, m equals 0 or 1, n equals 0 or 1, i equals 0 or 1, k equals zero or 1, x+y+z=1, x ranges from 0.05 to 0.75, y ranges from zero to 0.8 and z ranges from zero to 0.6.

3. The chemically amplified resist as set forth in claim 1, in which said chemically amplified resist is dissolved in a developing solution after selective photo radiation so as to form a negative resist pattern.

4. The chemically amplified resist as set forth in claim 2, in which said chemically amplified resist is dissolved in a developing solution after selective photo radiation so as to form a negative resist pattern.

* * * * *

UNITED STATES PATENT AND TRADEMARK OFFICE
CERTIFICATE OF CORRECTION

PATENT NO : 6,030,747
DATED : February 29, 2000
INVENTOR(S): Kaichiro NAKANO, Et al.

It is certified that error appears in the above-identified patent and that said Letters Patent are hereby corrected as shown below:

Claim 2, Line 5 (column 50, line 13) wherein $R^2$ should read $R^4$.

Signed and Sealed this

Tenth Day of April, 2001

*Attest:*

NICHOLAS P. GODICI

*Attesting Officer*   *Acting Director of the United States Patent and Trademark Office*